(12) United States Patent
Sun

(10) Patent No.: US 11,589,459 B2
(45) Date of Patent: Feb. 21, 2023

(54) CONNECTORS FOR INTEGRATING CONDUCTIVE THREADS TO NON-COMPATIBLE ELECTROMECHANICAL DEVICES

(71) Applicant: Nextiles, Inc., Brooklyn, NY (US)

(72) Inventor: George L. Sun, Brooklyn, NY (US)

(73) Assignee: Nextiles, Inc., Brooklyn, NY (US)

( * ) Notice: Subject to any disclaimer, the term of this patent is extended or adjusted under 35 U.S.C. 154(b) by 0 days.

(21) Appl. No.: 17/559,815

(22) Filed: Dec. 22, 2021

(65) Prior Publication Data

US 2022/0201854 A1 Jun. 23, 2022

Related U.S. Application Data

(60) Provisional application No. 63/129,599, filed on Dec. 23, 2020.

(51) Int. Cl.
*B32B 5/06* (2006.01)
*H05K 1/03* (2006.01)
(Continued)

(52) U.S. Cl.
CPC ............. *H05K 1/038* (2013.01); *B32B 3/266* (2013.01); *B32B 5/02* (2013.01); *B32B 5/073* (2021.05);
(Continued)

(58) Field of Classification Search
CPC ..................................................... B32B 5/073
See application file for complete search history.

(56) References Cited

U.S. PATENT DOCUMENTS 6,210,771 B1 * 4/2001 Post ..................... D03D 15/258
361/212
9,418,929 B1 8/2016 Low et al.
(Continued)

FOREIGN PATENT DOCUMENTS

CA 2862732 8/2013
DE 112017000189 8/2018
(Continued)

OTHER PUBLICATIONS

International Search Report and Written Opinion dated Jun. 7, 2022, by the European Patent Office in counterpart PCT Application No. PCT/US2021/065150, 13 pages.

*Primary Examiner* — Andrew T Piziali
(74) *Attorney, Agent, or Firm* — Finnegan, Henderson, Farabow, Garrett & Dunner LLP

(57) ABSTRACT

An electrical circuit assembly comprising: a circuit component, a fabric-based component, and a fastener is disclosed along with methods for fabricating the electrical circuit assembly and for using the electrical circuit assembly. The circuit component may comprise: a substrate layer comprising an integrated circuit disposed on the substrate layer; and a first conductive linkage electrically coupled to the integrated circuit. The fabric-based component may comprise: a fabric layer comprising a first at least one conductive thread; and a second conductive linkage electrically coupled to the first at least one conductive thread. The fastener may be configured to couple the circuit component and the fabric-based component at the first conductive linkage and the second conductive linkage.

32 Claims, 33 Drawing Sheets

(51) Int. Cl.
  *B32B 3/26* (2006.01)
  *B32B 5/02* (2006.01)
  *B32B 27/12* (2006.01)
  *D03D 1/00* (2006.01)
  *D04B 1/14* (2006.01)

(52) U.S. Cl.
  CPC .......... *B32B 27/12* (2013.01); *D03D 1/0088* (2013.01); *D04B 1/14* (2013.01); *H05K 1/0366* (2013.01); *B32B 2307/202* (2013.01); *B32B 2457/08* (2013.01); *D10B 2401/16* (2013.01); *D10B 2401/18* (2013.01); *D10B 2403/02431* (2013.01); *H05K 2201/029* (2013.01); *H05K 2201/0281* (2013.01)

(56) References Cited

U.S. PATENT DOCUMENTS

| | | | |
|---|---|---|---|
| 9,983,747 B2 | 5/2018 | Poupyrev | |
| 10,045,573 B2 | 8/2018 | Maxey et al. | |
| 10,458,866 B1 | 10/2019 | Sun | |
| 10,490,507 B1 | 11/2019 | Maxey et al. | |
| 10,612,172 B2 | 4/2020 | Harnett | |
| 2004/0259391 A1 | 12/2004 | Jung et al. | |
| 2005/0029680 A1 | 2/2005 | Jung et al. | |
| 2005/0235482 A1 | 10/2005 | Deaett et al. | |
| 2005/0277307 A1 | 12/2005 | Zollo et al. | |
| 2016/0270727 A1 | 9/2016 | Berg et al. | |
| 2017/0251555 A1* | 8/2017 | Sunshine | D03D 15/533 |
| 2019/0132950 A1 | 5/2019 | Berzowska et al. | |
| 2019/0310144 A1 | 10/2019 | Sun | |
| 2019/0371730 A1 | 12/2019 | Maxey et al. | |
| 2019/0373724 A1 | 12/2019 | Gouthez et al. | |
| 2019/0376214 A1 | 12/2019 | Perera et al. | |
| 2020/0008746 A1 | 1/2020 | Berg et al. | |
| 2020/0125195 A1 | 4/2020 | Tremmel et al. | |

FOREIGN PATENT DOCUMENTS

| | | |
|---|---|---|
| WO | WO 2014/207102 | 12/2014 |
| WO | WO 2015/017712 | 2/2015 |
| WO | WO 2019/134031 A2 | 7/2019 |

\* cited by examiner

200A

1500A

CONNECTORS FOR INTEGRATING CONDUCTIVE THREADS TO NON-COMPATIBLE ELECTROMECHANICAL DEVICES

CROSS-REFERENCE TO RELATED APPLICATIONS

This application claims the benefit of priority to U.S. Provisional Application No. 63/129,599, filed on Dec. 23, 2020, which is incorporated herein by reference in its entirety.

TECHNICAL FIELD

Embodiments of the present disclosure are in the field of wearable electronics that join individual conductive threads used to create fabric-based sensors with traditional electromechanical devices that rely on static chemical or mechanical bondage, creating a reverse and/or backward compatible design strategy through a series of connecting layers of conductive and non-conductive components.

BACKGROUND

The statements in the background of the invention are provided to assist with understanding the invention and its applications and uses, and may not constitute prior art. A challenge the wearable community faces is the ability to connect fabric-based materials to traditional circuit and electromechanical components, such as printed circuit boards (PCBs). Fabric materials have lower temperature tolerance (e.g., <200° F. or 95° C.) compared to electronic devices, metals, solderable connectable materials, or plastic materials; are vulnerable to many common electronic chemicals such as solder and acid/base solutions; and lack the mechanical robustness, such as tensile strength, tear strength, and yield strength that give hardware their distinct solid form-factor.

However, fabric-based materials provide more versatile form-factors, greater flexibility, and higher washing-and-drying tolerance. Furthermore, their ubiquity in today's day-to-day clothing makes fabric-based materials an attractive substrate for building and attaching devices. So far, these distinct properties of the soft-goods (e.g. fabrics) and the hard-goods (e.g. electronics) have created an industrial and manufacturing separation where they are rarely seen in product combinations in the market. Engineers have circumvented this chasm by physically attaching hard-goods onto straps or bands, or by mechanically tying hard-goods into pockets or laces that are then incorporated into a garment. These techniques are considered add-ons, however, rather than direct integration into the fabric substrate. These methods ultimately defeat the purpose of using fabric-based materials, and do not inherit their advantageous properties, such as fabric's flexible form-factor, flexibility, and washing-and-drying tolerance, and instead merely append the hard-good onto the apparel for the sake of aesthetics and function.

The disclosed assemblies and methods continue and expand upon the innovation disclosed in the patents and patent applications that are directed to fabric-based sensors and further render them compatible with traditional hard-goods and a wealth of electromechanical devices. Such patents and patent applications include, for example, U.S. Provisional Patent Application No. 62/622,845, filed on Jan. 27, 2018, and entitled "Design, Fabrication, and Use of Wearable Sensors and Controllers in the Shoe to Monitor, Analyze, and Assist in Gait and Other Bodily Movements"; to U.S. Provisional Patent Application No. 62/695,004, filed on Jul. 7, 2018, and entitled "Design, Fabrication, and Use of Wearable Sensors for Body Movement and Machine Learning Applications"; to U.S. Non-Provisional application Ser. No. 16/237,314 (now issued U.S. Pat. No. 10,378,975) filed on Dec. 31, 2018, and entitled "Systems, Methods, and Devices for Static and Dynamic Body Measurements"; to U.S. Non-Provisional application Ser. No. 16/451,166 (now issued U.S. Pat. No. 10,458,866) filed on Jun. 25, 2019, and entitled "Methods of Manufacturing Devices for Static and Dynamic Body Measurements"; to U.S. Non-Provisional application Ser. No. 16/573,727 (now issued U.S. Pat. No. 10,605,680) filed on Sep. 17, 2019, and entitled "Devices for Static and Dynamic Body Measurements"; to U.S. Provisional Patent Application No. 63/129,599, filed on Dec. 23, 2020, and entitled "Connectors for Integrating Conductive Threads to Non-Compatible Electromechanical Devices"; and to U.S. Provisional Patent Application No. 63/174,046, filed on Apr. 13, 2021, and entitled "Flexible Surface Electromechanical Devices for Mechanical Sensing and Measurements." The entire disclosures of the patents and patent applications enumerated above are incorporated herein by reference in their entireties.

Conventional systems and methods have failed to combine fabrics weaved with conductive threads and materials with other electromechanical devices for synergistic interfaces or fusion data (the act of combining multiple sensor data to create a new and computed metric). Some embodiments disclosed herein describe the creation of bonds, connectors, junctions, snaps, and other types of electromechanical connecting strategies such that fabric-based sensors and circuitry are backward compatible with existing hardware.

Prior art in this field fail to disclose a thread and fabric-based platform and generally teach away from such solutions, instead focusing on more chemically and mechanically harsh and crude methods. Existing solutions include conductive inks, thin metal sheets, adhesives such as epoxy, or coating entire fabric areas with metallized materials. These methods render known fabrics amenable for industrial standard connecting types, such as creating solder joins or conductive terminals, but ultimately still lose the benefits of the underlying fabric properties such as flexible, machine-washable, and comfortable form-factors.

Overall, there have been no solutions in the market that are able to combine sewn threads (i.e., threads that have penetrated and been weaved into fabric) with traditional electronic components. Moreover, none have been able to solve or achieve desirable use-cases posed, examples of which are set forth below:

a. How to sew conductive threads into fabric such that the threads are exposed on the fabric and capable of interfacing external components?

b. How to control the area of exposure of conductive threads on fabrics such that the area is sufficiently large to provide a stable electrical connection while maintaining a high signal-to-noise ratio?

c. How to work with the right and wrong side (e.g. top/bottom) of fabric and consider connector type strategies if the conductive thread is on the right or wrong side of the fabric?

d. How to electrically connect the bottom interfacing conductive thread with components above it, which are separated by woven fabric or by a series of intermediate layers?

e. How to terminate a conductive thread and join it with an adjacent component, either mechanically, electrically, electromechanically, magnetically, or chemically?

f. Which patterns (e.g., stitching, overlocking, or embroidery patterns) are optimal for securing conductive threads, in addition to connecting components?

g. How to securely bond a conductive thread with an electromechanical component that also protects against tearing, stress, and fraying?

h. How to securely bond a conductive thread with an electromechanical component that is not susceptible to stray mechanical and electrical noise and interference that are due to poor bondage, incompatible material types, or poor mechanical properties that are susceptible to motion noise?

i. How to create a reversible bond with a conductive thread and an electromechanical component (e.g., connectors that may be joined and separated repeatedly), while also considering join integrity such as tearing, stress, and fraying?

j. How may a thread, given its thin yet long dimensions, be bonded with (a) electromechanical components that are smaller than its dimensions (width scales of <1 mm; e.g. connecting threads with ball-grid-array (BGA)); or (b) electromechanical components that are much larger than its size (width scales of >1 cm; e.g. connecting threads with USB cables or solder pads)?

Past solutions have focused on either mechanical bonds (e.g., straps and tapes) or electrochemical bonds (e.g. chemicals that adhere with a conductive material), but no electromechanical or electromechanical-chemical bonds as described in this disclosure. The most ubiquitous solution is mechanical bonds, which involve latching hardware (e.g., accelerometers, also known under the category of inertial measurement units) to straps and have no signal or electrical connection to the underlying fabric. This "pseudo-wearable" is simply appending a device onto a fabric-like substrate.

More embedded, yet conventional solutions involve electrochemical bonds; these solutions have relied on conductive inks, heat-pressed conductive sheets/polymers, conductive adhesives, or entire layers of conductive fabrics. None of these conventional solutions, however, is able to bond individual conductive threads.

These conventional solutions are also less than ideal. For example, conductive inks are unstable and routinely fracture when stretched. An analogy is stretching dried paint, which forms cracks. Conductive inks require harsh chemical processes to formulate the conductive liquid. These liquids contain hazardous polymers and solvents that (1) are difficult to handle without laboratory equipment and filters, (2) are environmentally un-friendly, (3) are expensive, and (4) have a short lifespan on fabrics. Conductive inks are limited to a set number of chemicals that are capable of emulsification and liquification. These may include simple conductive polymers or elements like silver and carbon. More exotic chemicals exist, but they are more dangerous and/or costly. Due to cost and health constraints, chemicals routinely rely on a lower-performing metal/ink mixture.

Further, conductive inks typically act as an interface between the fabric and an adjacent electromechanical device. They are rarely used to directly join components together. For example, deposited and cured inks are either soldered or crimped to another connector such as a wire, and finally onto the desired hardware component. Using conductive inks is a subtractive process. For example, a stencil or template is used where inks are poured uniformly on the surface. The stencil is removed to reveal the areas that are exposed, and material on the stencil is either recycled or discarded. This thrown away excess adds to the cost and slow production life cycle of using conductive inks.

Conductive sheets and textiles are created by depositing conductive material onto a thin substrate, either a plastic or a synthetic fabric material. This process also requires a sophisticated laboratory setup that requires the control of vapor pressures, humidity, vacuum, temperature, and other environmental and chemical factors. Conductive sheets are capable of connecting adjacent terminals only if they lie on the same plane. Conversely, typically in sewing, conductive threads may be either within, above, or below the fabric, which means conductive sheets are only usable if the conductive thread is exposed on the same surface as the conductive sheet. Application of this process requires intense temperature and pressure for proper bondage. The bondage is typically permanent. Finally, the bonding process is also subtractive, where sheets of conductive materials are applied and cut to remove excess.

The chemicals used in conductive adhesives are limited, and therefore produce poor conductors. Conductive adhesives make poor conductive contact and are highly susceptible to mechanical and stray electrical noise. Application of conductive adhesives ruins the underlying fabric properties of the fabric on which they are applied. In particular, applying conductive adhesives to a fabric may cause, for example, solidification or hardening of the fabric material, as well as overall poor aesthetics and a decrease in comfortability. Conductive adhesives are typically applied last and are applied on the top-most layer when all components are set.

It is against this background that the innovative embodiments disclosed herein were developed.

BRIEF SUMMARY

The embodiments of the present disclosure set forth herein relate to options to join individual conductive threads used to create fabric-based sensors with electromechanical devices that rely on static chemical or mechanical bondage.

One aspect of the present disclosure is directed to an electrical circuit assembly comprising: a circuit component, a fabric-based component, and a fastener. The circuit component may comprise: a substrate layer comprising an integrated circuit disposed on the substrate layer; and a first conductive linkage electrically coupled to the integrated circuit. The fabric-based component may comprise: a fabric layer comprising a first at least one conductive thread; and a second conductive linkage electrically coupled to the first at least one conductive thread. The fastener may be configured to couple the circuit component and the fabric-based component at the first conductive join and the second conductive linkage.

Another aspect of the present disclosure is directed to an electrical circuit assembly comprising: one or more circuit components, one or more fabric-based components, and one or more fasteners. The one or more circuit components may each comprise: a substrate layer comprising an integrated circuit disposed on the substrate layer; and a first conductive linkage electrically coupled to the integrated circuit. The one or more fabric-based components may comprise: one or more fabric layers, wherein a subset of the one or more fabric layers comprise at least one conductive thread; and one or more second conductive linkages electrically coupled to the at least one conductive thread. The one or more fasteners may be configured to couple the one or more circuit components and the one or more fabric-based components at the one or more first conductive linkages and the one or more second conductive linkages, wherein the one or more first conductive linkages and the one or more second conductive linkages are aligned to a common vertical axis or laterally offset.

Another aspect of the present disclosure is directed to a method of fabricating an electrical circuit assembly. The method may comprise: providing a substrate layer comprising an integrated circuit disposed on the substrate layer; forming a first conductive linkage electrically coupled to the integrated circuit; providing a fabric layer comprising a first at least one conductive thread; forming a second conductive linkage electrically coupled to the first at least one conductive thread; and coupling the substrate layer and the fabric layer using a fastener at the first conductive linkage and the second conductive linkage.

Still further, another aspect of the present disclosure is directed to a method of fabricating an electrical circuit assembly. The method may comprise: providing one or more substrate layers, each comprising an integrated circuit disposed on the corresponding substrate layer; forming one or more first conductive linkages electrically coupled to the one or more integrated circuits; providing one or more fabric layers comprising first one or more conductive threads; forming one or more second conductive linkages electrically coupled to the first one or more conductive threads; arranging the one or more substrate layers and the one or more fabric layers, wherein the one or more first conductive linkages and the one or more second conductive linkages are aligned to a common vertical axis or laterally offset; and coupling the one or more substrate layers and the one or more fabric layers using a fastener at the one or more first conductive linkages and the one or more second conductive linkages.

Other aspects and embodiments of the present disclosure include the methods and processes comprising the steps described herein, and also include the processes and modes of operation of the systems and devices described herein.

Yet other aspects and embodiments of the present disclosure will become apparent from the detailed description of the invention when read in conjunction with the attached drawings.

BRIEF DESCRIPTION OF THE DRAWINGS

Embodiments of the present disclosure described herein are examples, and not restrictive. Embodiments will now be described, by way of examples, with reference to the accompanying drawings, in which.

Figure 1A:
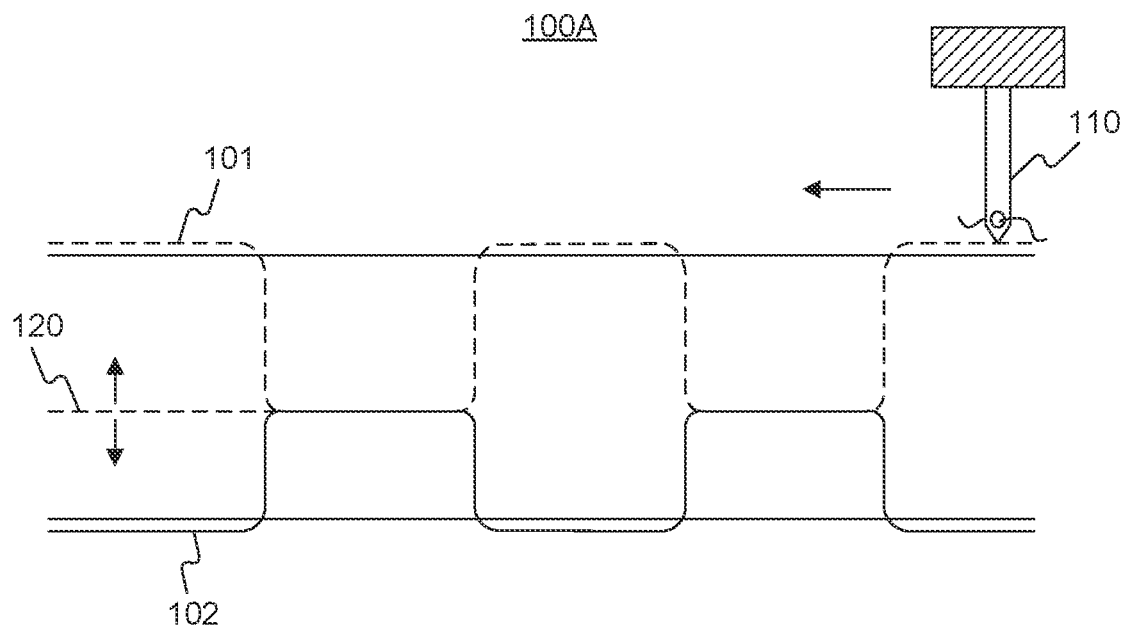
FIG. 1A shows a cross-sectional view of an example threading scheme of a conductive thread using a top thread and a bobbin, in accordance with example embodiments of the disclosure.

Throughout the figures, identical reference characters and descriptions indicate similar, but not necessarily identical, elements. While the example embodiments described herein are susceptible to various modifications and alternative forms, specific embodiments have been shown by way of example and will be described in detail herein. However, the example embodiments described herein are not intended to be limited to the particular forms disclosed. Rather, the instant disclosure covers all modifications, equivalents, and alternatives falling within this disclosure.

DETAILED DESCRIPTION

With reference to the figures provided, embodiments of the present disclosure are now described in detail.

In the following description, for purposes of explanation, numerous specific details are set forth in order to provide a thorough understanding of the present disclosure. Although the following description contains many specifics for the purposes of illustration, anyone skilled in the art will appreciate that many variations and/or alterations to suggested details are within the scope of the present disclosure. Similarly, although many of the features of the present disclosure are described in terms of each other, or in conjunction with each other, one skilled in the art will appreciate that many of these features can be provided independently of other features. Accordingly, this description is set forth without any loss of generality to, and without imposing limitations upon, the disclosure.

FIG. 1A shows a cross-sectional view 100A of an example threading scheme of a conductive thread using a top thread 101 and a bobbin 102, in accordance with example embodiments of the disclosure. Specifically, FIG. 1A shows a cross-sectional view of a sewing scheme that uses a mechanized sewing machine 110 stitching a top-thread 101 and a bobbin 102 or bottom-thread. Either thread may be an insulating thread or a conductive thread. The area of intersection 120 of the threads is controlled by the tension of the threads, where it may be neutral in the center, pulled towards the top of the fabric with higher tension, or pulled towards the bottom of the thread with lower tension.

Figure 1B:
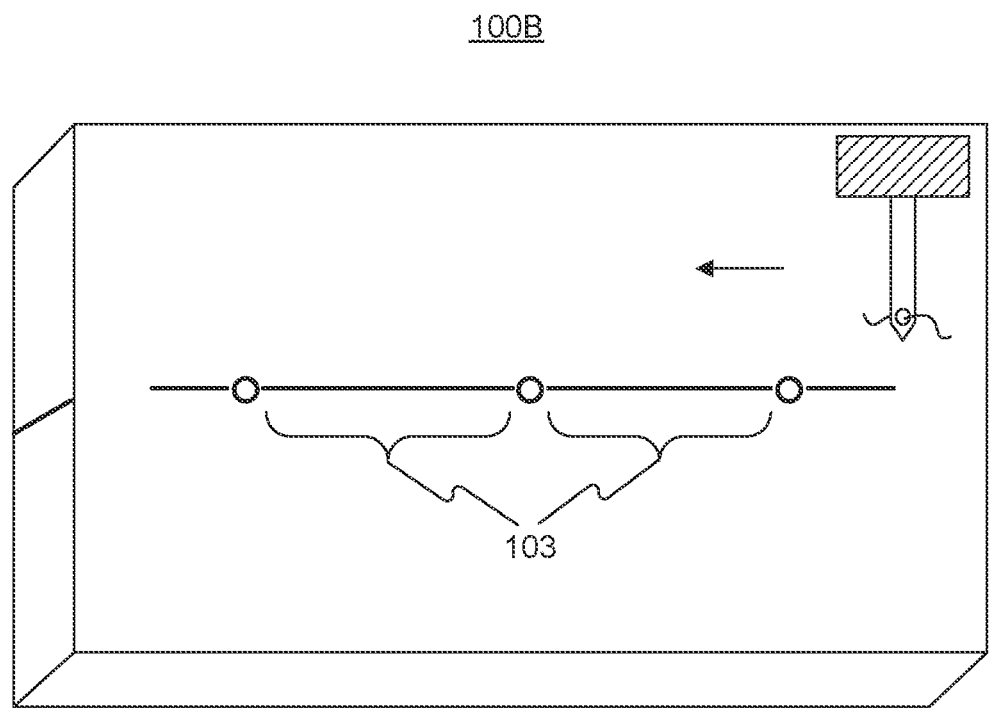
FIG. 1B shows a top view of the threading scheme shown in FIG. 1A in accordance with example embodiments of the disclosure.

FIG. 1B shows a top view 100B of the threading scheme shown in FIG. 1A in accordance with example embodiments of the disclosure. The tension, stitch length, thread weight, thread density, thread ply-count, and the number or length of cross-stitches determine the amount of exposed thread 103, as shown in the top view illustrated in FIG. 1B. The amount of exposed thread 103 may determine the dimensions of a conductive linkage (not shown) to which the exposed thread is attached to make a connection with another device. The designer, i.e., the entity responsible for manufacturing a device using this type of threading scheme, has control over various aspects of the device, such as the tension, stitch length, thread weight, thread density, thread ply-count, number of cross-stitches, and overall location and placement of the thread on the fabric.

Figure 2A:
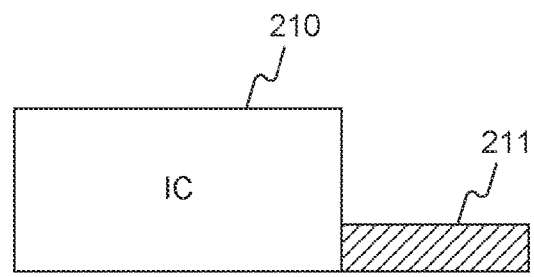
FIG. 2A shows a cross-sectional view of an example integrated circuit (IC) with conductive pinout(s), in accordance with example embodiments of the disclosure.
Figure 2B:
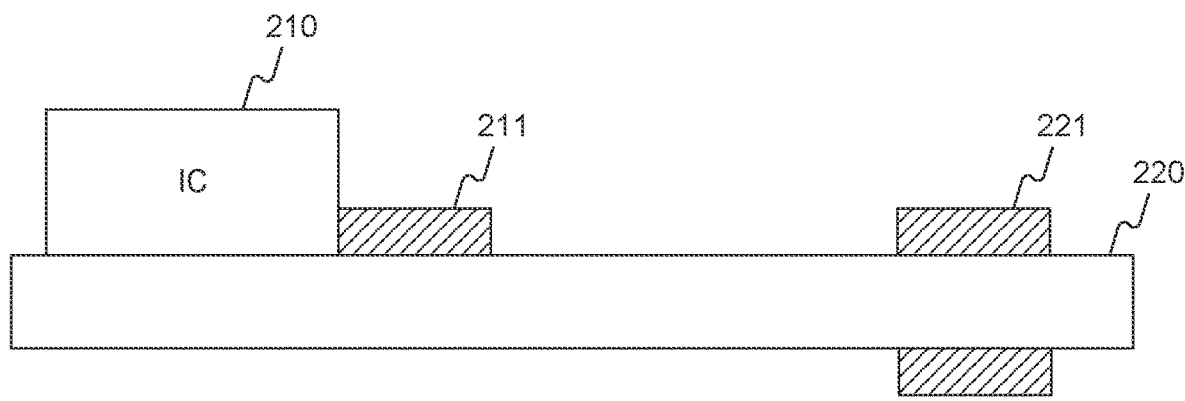
FIG. 2B shows a cross-sectional view of the example integrated circuit shown in FIG. 2A, conductively routed to a conductive pad elsewhere on a substrate, in accordance with example embodiments of the disclosure.
Figure 2C:
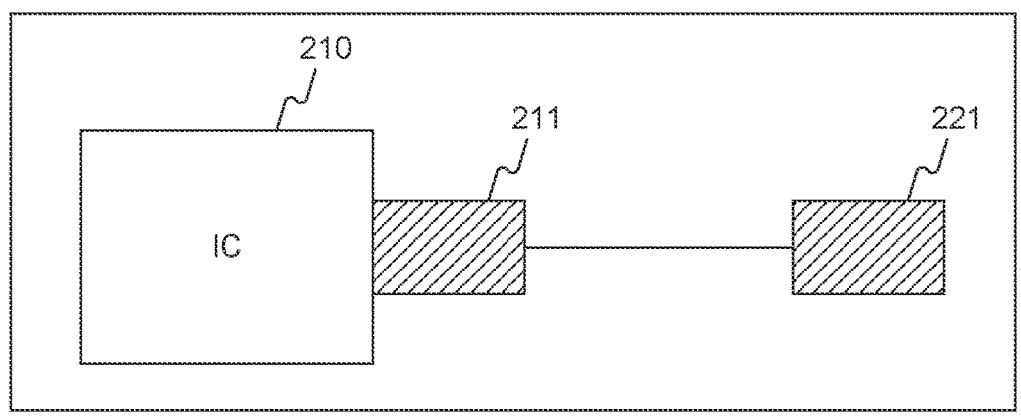
FIG. 2C shows a top view of the example IC shown in FIG. 2B, in accordance with example embodiments of the disclosure.

FIG. 2A shows a cross-sectional view 200A of an example IC 210 with conductive pinout(s) 211 (i.e., the legs or pads that are soldered onto circuit boards for power and electrical signals), in accordance with example embodiments of the disclosure. Conductive pinout 211 is conductively routed typically with copper solder pads or etched conductive traces (not shown) in a substrate 220 to a terminating lead 221, as shown in FIG. 2B, with an alternative top view shown in FIG. 2C.

Figure 3A:
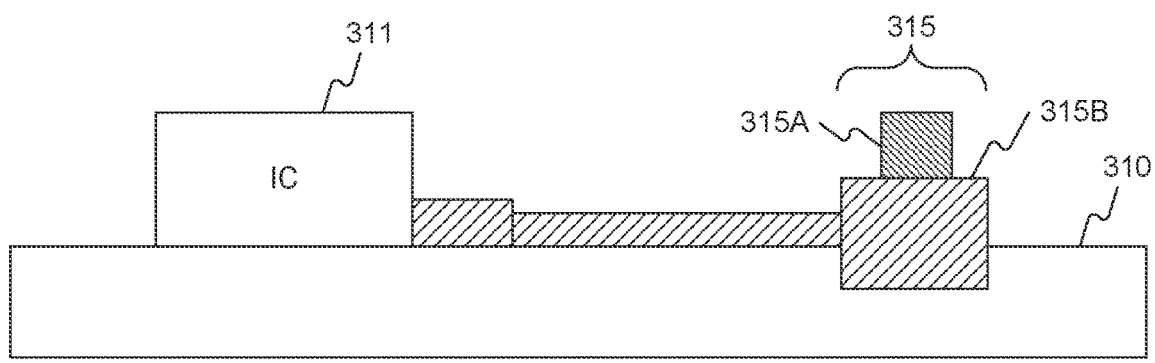
FIG. 3A shows a cross-sectional view of an IC, showing a conductive linkage connected to the conductive pinout of the IC, in accordance with example embodiments of the disclosure.

FIG. 3A shows a cross-sectional view 300A of an example IC 311, showing a conductive linkage 315. The IC 311 is attached on a substrate 310, typically a PCB or flexible circuit board, that is conductively routed to a terminating conductive lead, otherwise known in this disclosure as the conductive linkage 315. More so, the conductive linkage 315 may include further modifications (e.g., on top section 315A) with electro or mechanical properties in order to adopt additional features for connection compatibility, material robustness, or general aesthetics. For example, the designer may have the option of selecting the type of conductive linkage, the orientation of the conductive linkage (e.g. top, bottom, and amount of exposure on the cis side or the opposite side), and the placement of the conductive linkage that is compatible to the distance, thickness, material properties of the IC and the conductive fabric.

As used herein, a conductive linkage may refer to a combination of multiple parts, components, or portions, which may be assembled reversibly or irreversibly as described below. In one example, the conductive linkage 315 may comprise multiple sections (e.g., top section 315A and bottom section 315B) that can be made from different conductive materials, as illustrated by the different cross hatches depicted in FIG. 3A.

Figure 3B:
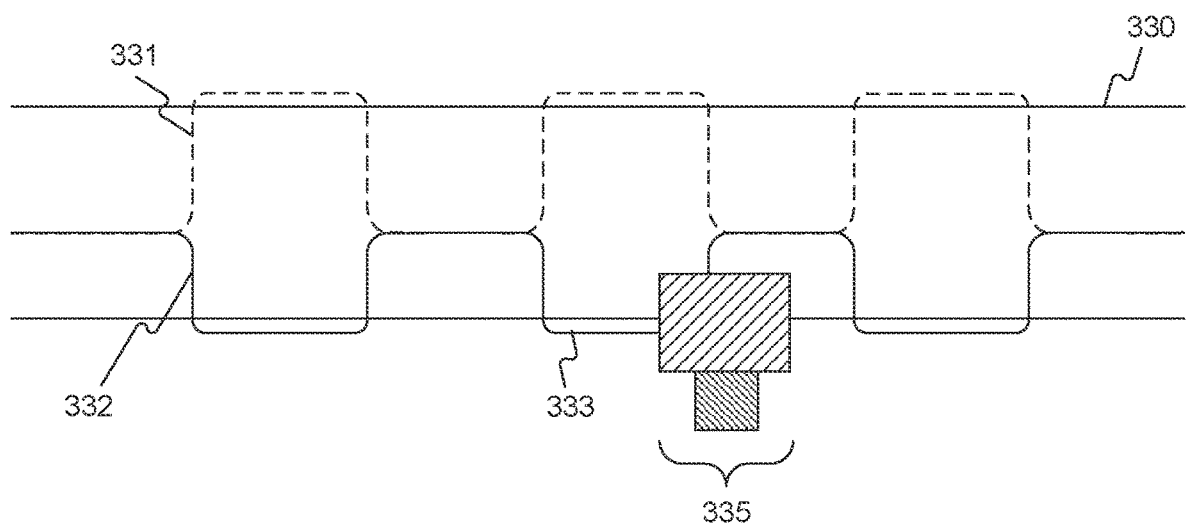
FIG. 3B shows a cross-sectional view of a fabric sewn with a non-conductive thread and a conductive thread, showing a conductive linkage interfacing with an exposed segment of the conductive thread, in accordance with example embodiments of the disclosure.

FIG. 3B shows a cross-sectional view 300B of a fabric 330 sewn with a non-conductive thread 331 and a conductive thread 332, showing a conductive linkage 335 interfacing with an exposed segment 333 of the conductive thread 332. The conductive linkage 335 may be located at the top or bottom surface of the fabric 330. The conductive linkage 335 may include further modifications (not shown) with electro or mechanical properties in order to adopt additional features for connection compatibility, material robustness, or general aesthetics. In such embodiments, the conductive linkage 335 either must have a surface area that is greater than the exposed thread length of the conductive thread, or must penetrate the substrate to bond to a sufficient surface area of the embedded conductive thread 332. As disclosed herein and in further embodiments described below, the fabric 330 with embedded non-conductive thread 331 and conductive thread 332 may be a part of any fabric-based component, which may include, but is not limited to, a connector, sensor, processing unit, or any other circuitry configured to conduct electricity therein.

Figure 3C:
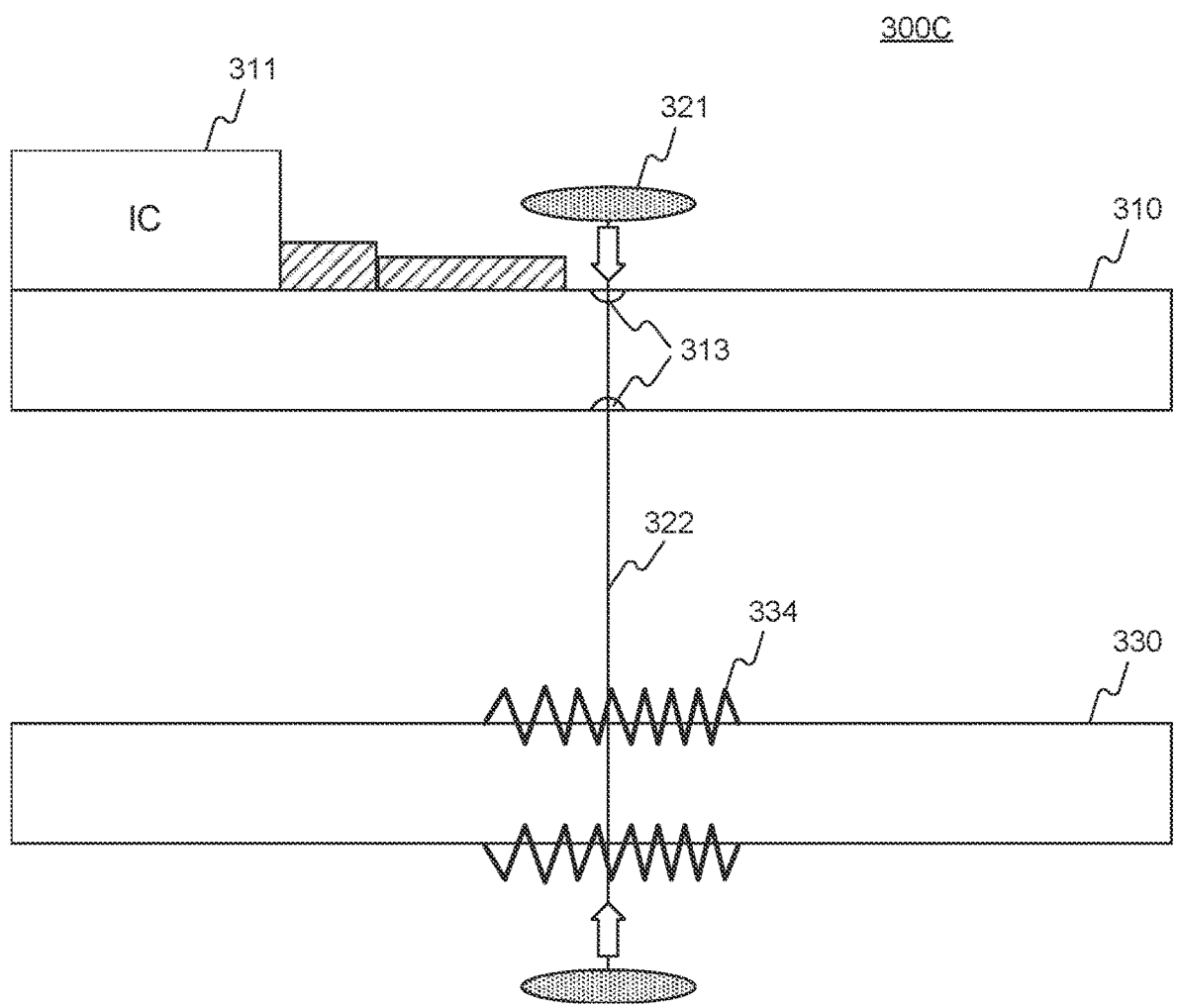
FIG. 3C shows an exploded view of an example fabric-PCB interface, in accordance with example embodiments of the disclosure.

FIG. 3C shows an exploded view 300C of an example fabric-PCB interface. The fabric-PCB interface may comprise an IC 311 being electromechanically bonded onto a PCB 310 and an underlying fabric 330 with an embroidered patch 334 of conductive thread, which interfaces with its underlying conductive thread (not shown). The PCB 310 and the fabric 330 may be interfaced (e.g., electrically coupled) using a conductive clamp 321 at the top of the PCB 310 and at the bottom of the fabric 330, each acting as a component of a conductive linker, and bonding the two layers together with a penetrating portion 322 of the conductive linker that is capable of penetrating all intermediate layers of the PCB 310 and the fabric 330. The conductive linker may be a thread, needle, a chemical liquid (e.g., epoxy, adhesive, or solder) that permeates each layer and then cures or hardens, a crimp, or a rivet.

In some embodiments, the interface may be formed by modifying or fabricating the PCB 310 with a via 313 or a conductively enshrouded hole through its substrate. The via 313 may act as a component of a conductive linkage on the PCB 310. Components of the conductive linker and the conductive linkage facing each other (e.g., the top portion of the via 313 facing the portion of the conductive clamp 321) may be configured to have a surface area compatible with each other. For example, the surface area of the bottom surface of the conductive clamp 321 may be greater than or equal to the surface area of the top portion of the via 313.

In some embodiments, the embroidered patch 334 on the fabric 330 may be configured to act as a conductive linkage on the fabric 330. The embroidered patch 334 may be an electromechanically compatible component that is complementary to an adjoining conductive linkage (e.g., the bottom portion of the via 313 facing the fabric 330) on the PCB 310. For example, the embroidered patch 334 may be created by sewing, embroidering, lacing, bonding, folding, and/or curing with an adhesive that is electromechanically compatible with the complementary conductive linkage on the PCB 310 (e.g., the bottom portion of the via 313). In this way, the embroidered patch 334 may serve as a mechanical pore through which the fabric 330 may be conductive. The conductive linkage on the PCB (i.e., the via 313) and the complementary conductive linkage on the fabric 330 (e.g., the embroidered patch 334) may then be electromechanically attached through a reversible or irreversible means such as the conductive clamp 321 and the penetrating portion 322.

Figure 4A:
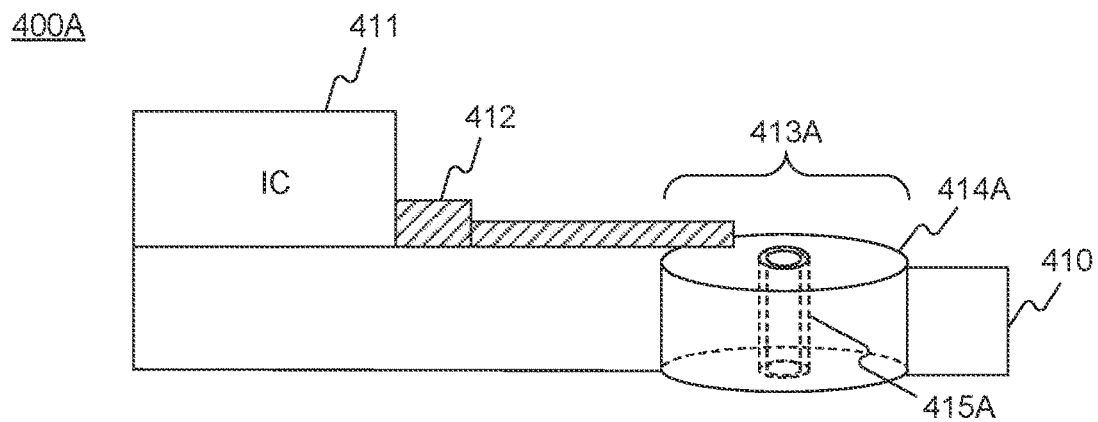
FIG. 4A shows a combination of cross-sectional and perspective view of an example conductive linkage that is conductively connected to a conductive pinout of an IC, in accordance with example embodiments of the disclosure.

FIG. 4A shows a combination of cross-sectional and perspective view 400A of an example conductive linkage 413A that is conductively connected to a conductive pinout 412 of an IC 411, in accordance with example embodiments of the disclosure. The conductive linkage 413A may be an exposed via 414A with the interior 415A of the hole coated with a conductive material that is compatible with the PCB 410. Via 414A may be sized appropriately to interface with another component of the conductive linkage 413A on the fabric (not shown) either through a snapping mechanism, or through a conductive linker that acts to snap two conductive linkages of the IC and fabric (not shown) together.

Figure 4B:
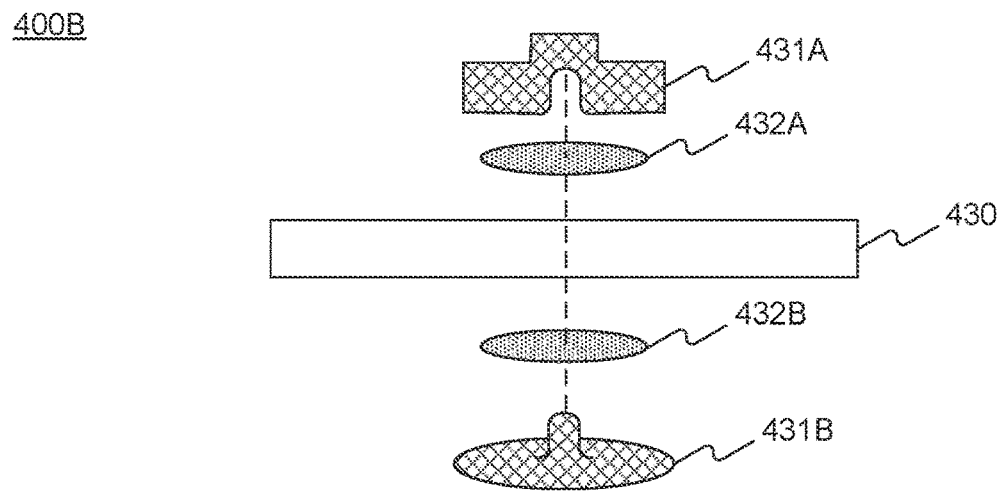
FIG. 4B shows an exploded view of another example conductive linkage that interfaces with a fabric with conducive threads, in accordance with example embodiments of the disclosure.

FIG. 4B shows an exploded view 400B of another example conductive linkage that interfaces a fabric 430 with conducive threads (not shown), in accordance with example embodiments of the disclosure. The conductive linkage of FIG. 4B may be configured to be complementary to the conductive linkage of FIG. 4A, such that the PCB 410 of FIG. 4A and the fabric 430 of FIG. 4B can be mated to form an electrical connection. In this case, the conductive linkage uses a mechanical crimping mechanism 431A and 431B to add layers 432A and 432B of conductive material on the top and bottom surfaces of the fabric 430, where layers 432A and 432B also penetrate the interior of the fabric 430 and thereby contact the exposed and interior conductive threads (not shown) of the fabric 430, forming a sandwich of conductive material. The sandwich of conductive material may create a robust conductive unit on the fabric 430 at a fixed location. The designer may select an appropriate location such that the contact strength and robustness of the connection between a PCB (not shown) and the fabric 430 with the conductive thread layer are optimized.

Figure 4C:
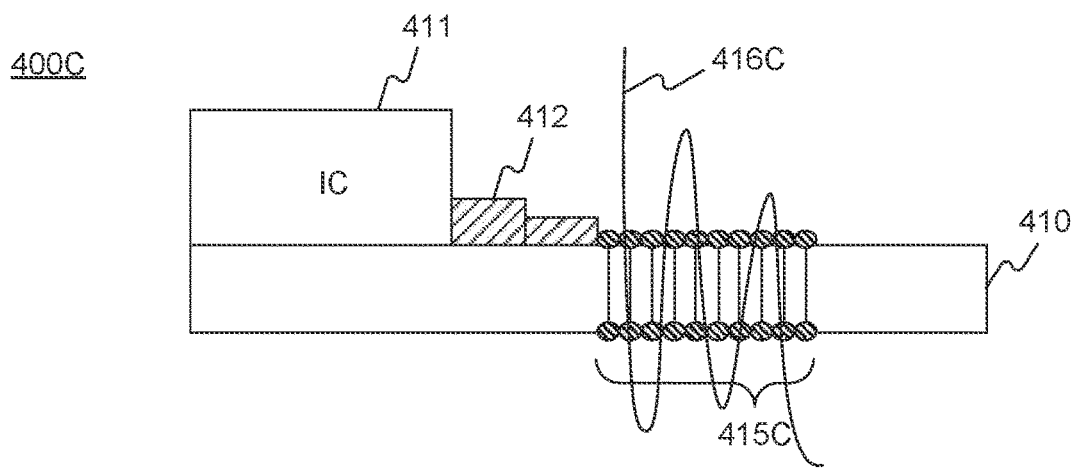
FIG. 4C shows a cross-sectional view of another example conductive linkage that uses embroidered conductive threads, in accordance with example embodiments of the disclosure.

FIG. 4C shows a cross-sectional view 400C of another example conductive linkage that uses embroidered conductive threads, in accordance with example embodiments of the disclosure. PCB 410 may comprise, at least in part, of a penetrable material 415C that is able to be embroidered with multiple stitching paths of conductive threads 416C. The stitch path of the embroidered stitching path may be spatially aligned with the pores or penetrable areas of the semi-porous material in 410.

In some embodiments, penetrable material 415C may comprise a porous or semi-porous material or a thin plastic material that may be conductive and connected to the pinout 412 of the IC 411. For example, the porous or semi-porous material may comprise loosely packed fibers that contain deliberate gaps, pores, or holes, which can be penetrated if stretched or compressed, such as lingerie or knitted fabrics with large spacing between fibers. Similarly, thin plastic material may comprise plastic materials that are weak enough to be penetrated. In further embodiments, penetrable material 415C may comprise fabric or plastic materials that are self-healing, in which puncturing the materials does not leave a residual hole. Still further, penetrable material 415C may comprise the porous or semi-porous materials covered with a silicone layer to achieve such self-healing property.

Figure 4D:
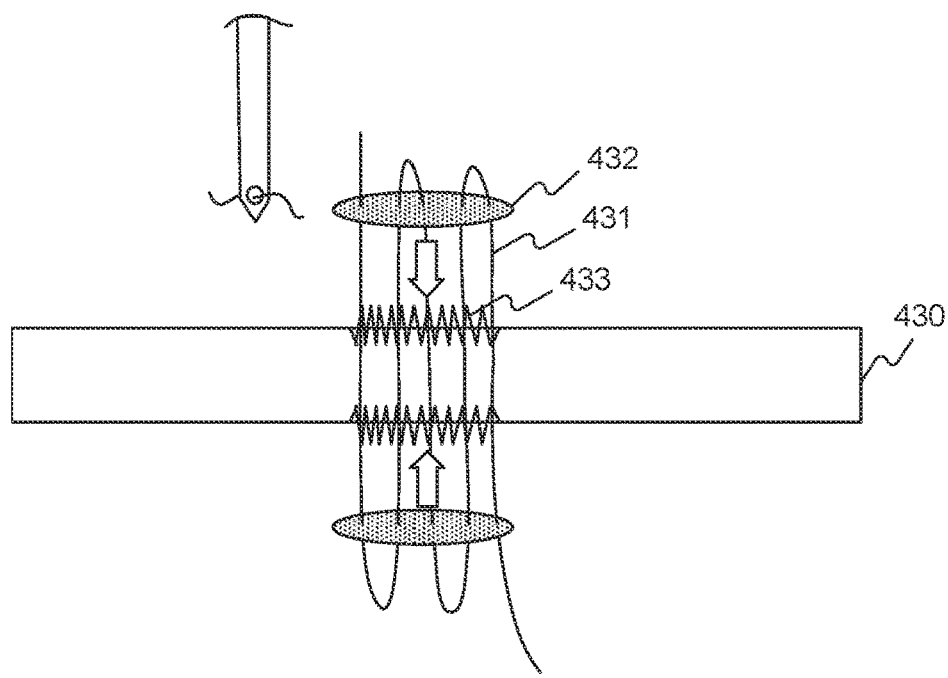
FIG. 4D shows an exploded view of another example conductive linkage that interfaces with a fabric using embroidered conductive threads, in accordance with example embodiments of the disclosure.

FIG. 4D shows an exploded view 400D of another example of a conductive linkage that interfaces with a fabric 430 using embroidered conductive threads, in accordance with example embodiments of the disclosure. Here, the conductive linkage may use another set of conductive threads 431 to sew a conductive patch 432 of material over an embroidered patch 433 of conductive thread either made by sewing or embroidery. In some embodiments, the conductive linkage of FIG. 4C and the conductive linkage of FIG. 4D may be combined together in the same embroidery step, such that the PCB 410 of FIG. 4C and the fabric 430 of FIG. 4D can be sewn together using the same conductive thread to permanently join the two layers together (i.e., the conductive thread 416C of FIG. 4C and the conductive thread 431 of FIG. 4D can be one continuous string of thread).

Figure 4E:
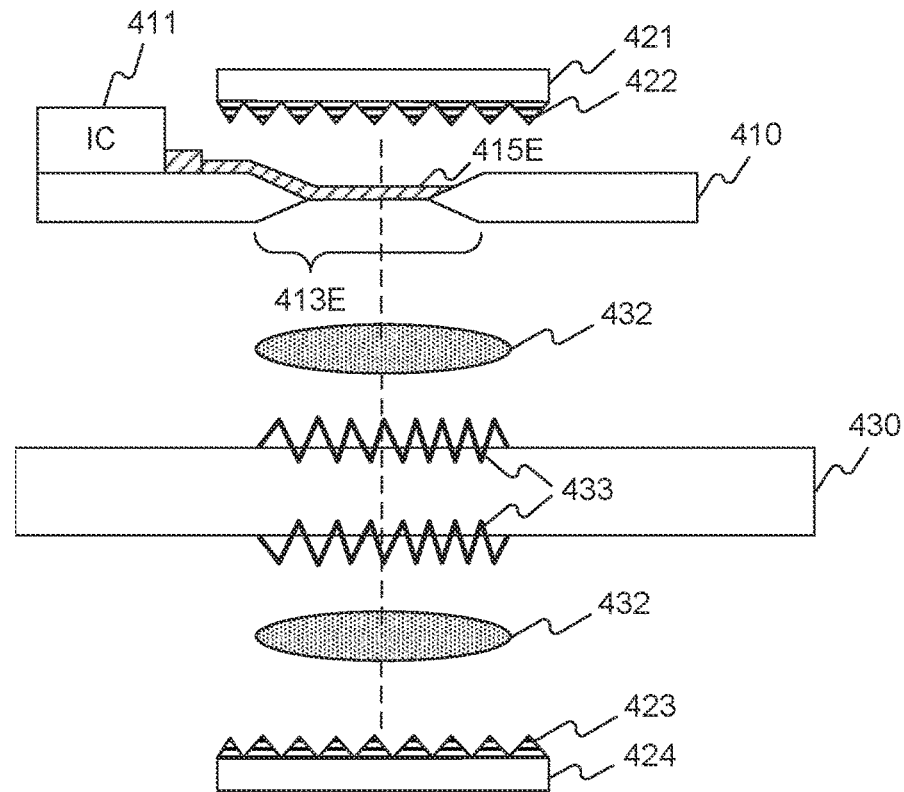
FIG. 4E shows an exploded view of an example fabric-PCB interface using conductive edges, in accordance with example embodiments of the disclosure.

FIG. 4E shows an exploded view 400E of an example fabric-PCB interface using conductive edges, in accordance with example embodiments of the disclosure. In this embodiment, a PCB 410 comprising an IC 411 is interfaced with a fabric 430 sewn with conductive threads (not shown) using a crimping technique. An example of a process for accomplishing this may include first modifying the PCB 410 with a conductive valley 413E that is semi-permeable. For example, the conductive valley 413E may comprise a conductive material 415E that can be punctured through, such that teeth (e.g., 422), a needle, or other electromechanical mechanism can penetrate the conductive material 415E and be conductively coupled to other conductive components (e.g., 432). In some embodiments, the conductive material 415E may be conductively connected to the IC 411, such that the IC 411 and the other conductive components of the fabric-PCB interface can be electrically coupled. Examples of the conductive material 415E may comprise thin sheets of tin oxide or any material layered or impregnated with a conductive polymer, such as carbon, silver, or the like.

Next, the fabric 430 to be bonded may be modified to comprise an embroidered patch 433 through sewing, embroidering, lacing, bonding, folding, or curing with an adhesive. The embroidered patch 433 may then be reinforced with a conductive patch 432 on both the top and bottom sides of the fabric 430 to both strengthen the mechanical connection as well as expose a larger conductive region. Thereafter, crimps 421 and 424 may be introduced at the top of the PCB 410 above the conductive valley 413E and at the bottom of the fabric 430, respectively. Crimps 421 and 424 may then be press fitted together to form an irreversible mechanical connection between the PCB 410 and the fabric 430. The teeth 422 and 423 of crimps 421 and 424, respectively, may act as parts of a conductive linker that penetrates the conductive material 415E exposed on the PCB 410, which may be a thin or porous conductive membrane, and may be sandwiched with the underlying fabric 430. In some embodiments, to reinforce the electromechanical connection, the underlying fabric 430 containing the conductive thread (not shown) may be simultaneously stacked with additional conductive material (not shown) to increase the conductive surface area and the bond strength when layered against the PCB 410.

In some embodiments, this method may be permanent, because the top crimped teeth 422 may be irreversibly connected to the bottom crimped teeth 423 when bonded. Attempts to disassemble the connection may damage the crimped teeth 422 and/or 423. Alternatively, this method may be designed to be reversible, where the crimped teeth 422 and 423 are only used to bond to the fabric 430, as shown in FIG. 4F.

Figure 4F:
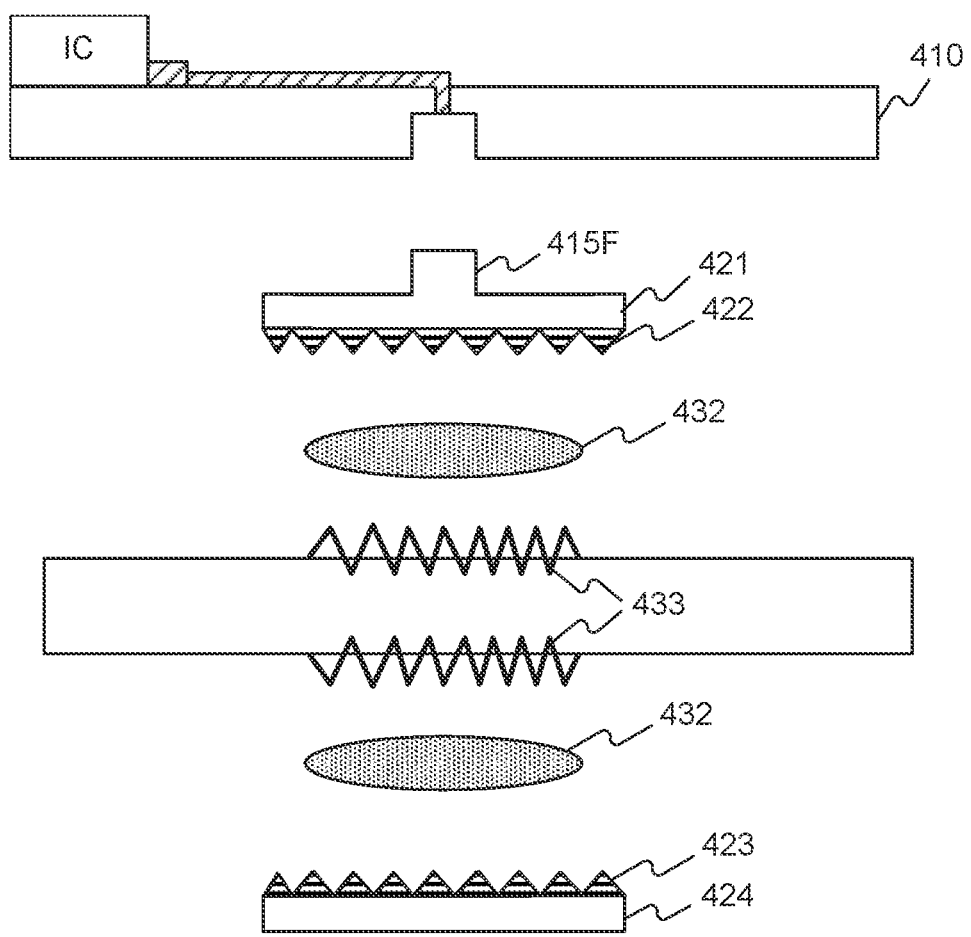
FIG. 4F shows an exploded view of another example fabric-PCB interface using conductive edges, whereas the conductive edges top layer is conductively bonded to the conductive linkage of the IC, in accordance with example embodiments of the disclosure.

FIG. 4F shows an exploded 400F of another example fabric-PCB interface using conductive edges, in accordance with example embodiments of the disclosure. This example fabric-PCB interface may be similar to that of FIG. 4E, except that one side of the crimps (e.g., 421) is situated below the PCB 410 and modified to be electromechanically connected to the PCB 410 using a reversible technique, such as by using a snap 415F or a magnet.

Figure 4G:
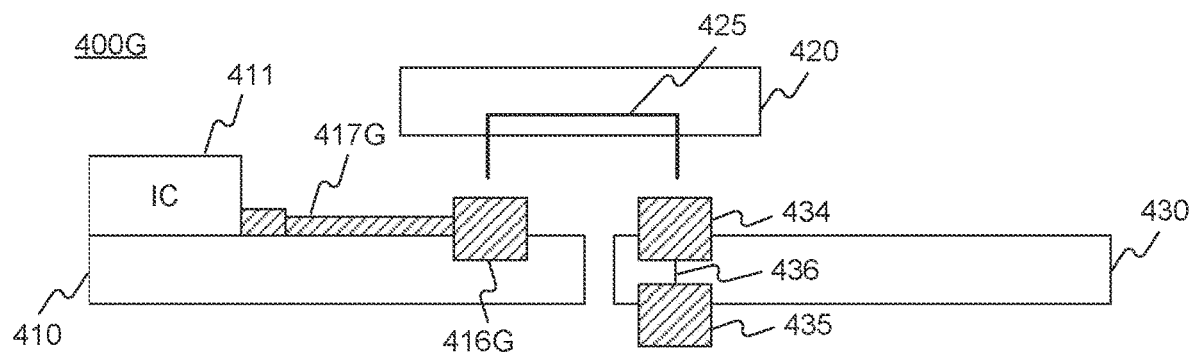
FIG. 4G shows an example fabric-PCB interface in a horizontal direction, in accordance with example embodiments of the disclosure.

FIG. 4G shows a diagram 400G of an example fabric-PCB interface in a horizontal direction, in accordance with example embodiments of the disclosure. Here, a PCB 410 comprising an IC 411 is horizontally combined with an adjacent fabric 430 with sewn conductive threads (not shown), such that the PCB 410 is laterally offset from the fabric 430. This may be accomplished by modifying the PCB 410 with a conductive patch 416G electromechanically bonded to the metal trace 417G, which is either milled or etched within the PCB 410. The modification may be performed via processes such as chemical vapor deposition, milling, chemical etching, adhesive bonding, and/or conductive epoxy application. The adjacent piece, i.e., either the fabric 430 or a flexible substrate, may be modified both on the top and on the bottom sides with a top modification 434 and a bottom modification 435, respectively. The top modification 434 and the bottom modification 435 may be connected by an internal conductive connection 436 therebetween. The modification may be performed via processes such as sewing, embroidering, chemical dipping, spraying, adhesive bonding, epoxy bonding, laminating, installing crimps, and/or installing magnetic snaps.

The modifications on the PCB 410 and on the fabric 430 may then be electromechanically connected with an intermediary connector 420 that has been modified with conductive segments 425 on its two ends, which is capable of mechanically latching onto the conductive linkages from the PCB 410 (e.g., the conductive patch 416G) and the fabric 430 (e.g., the top and bottom modifications 434 and 435). In some embodiments, the intermediary connector 420 may be configured and arranged to latch onto the conductive linkages from the PCB 410 and the fabric 430 as long as they are laterally offset from each other, regardless of whether the PCB 410 and the fabric 430 overlap.

Figure 4H:
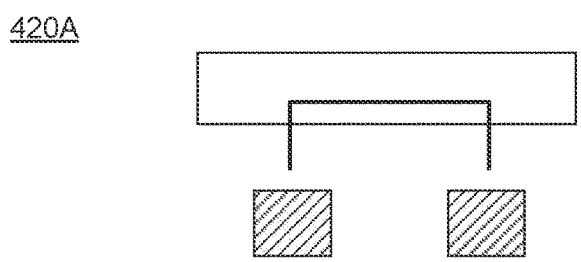
FIG. 4H shows various embodiments of intermediary connectors, in accordance with example embodiments of the disclosure.
Figure 4H:
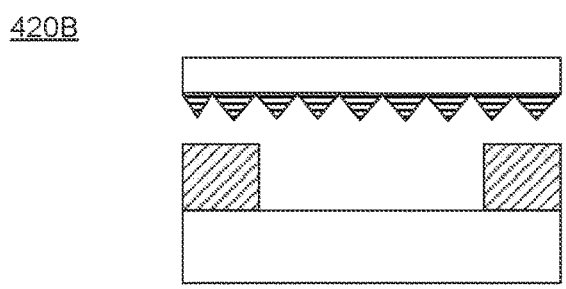
Figure 4H:
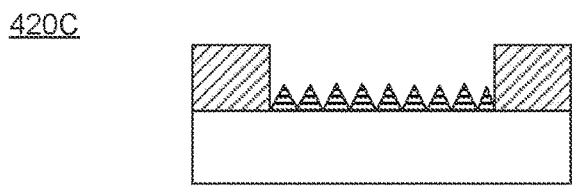

This intermediary connector 420 (also known as a conductive linker) may be made from a fabric, a plastic, or a solid metal substrate. The conductive segments 425 (which may include a conductive thread sewn into the intermediary connector 420) may be electromechanically connected on the bottom and on the top surface of the fabric 430, and be linked to the conductive patch 416G on the PCB 410 with an external clamping mechanism (e.g., a crimp), which itself is electrically connected. FIG. 4H shows various embodiments 420A-420C of such intermediary connector, in accordance with example embodiments of the disclosure. For example, external clamping mechanisms may include conductive teeth, which penetrate both surfaces of the PCB 410 and the fabric 430; may be embroidered; or may be a variety of other bonding mechanisms.

Figure 5A:
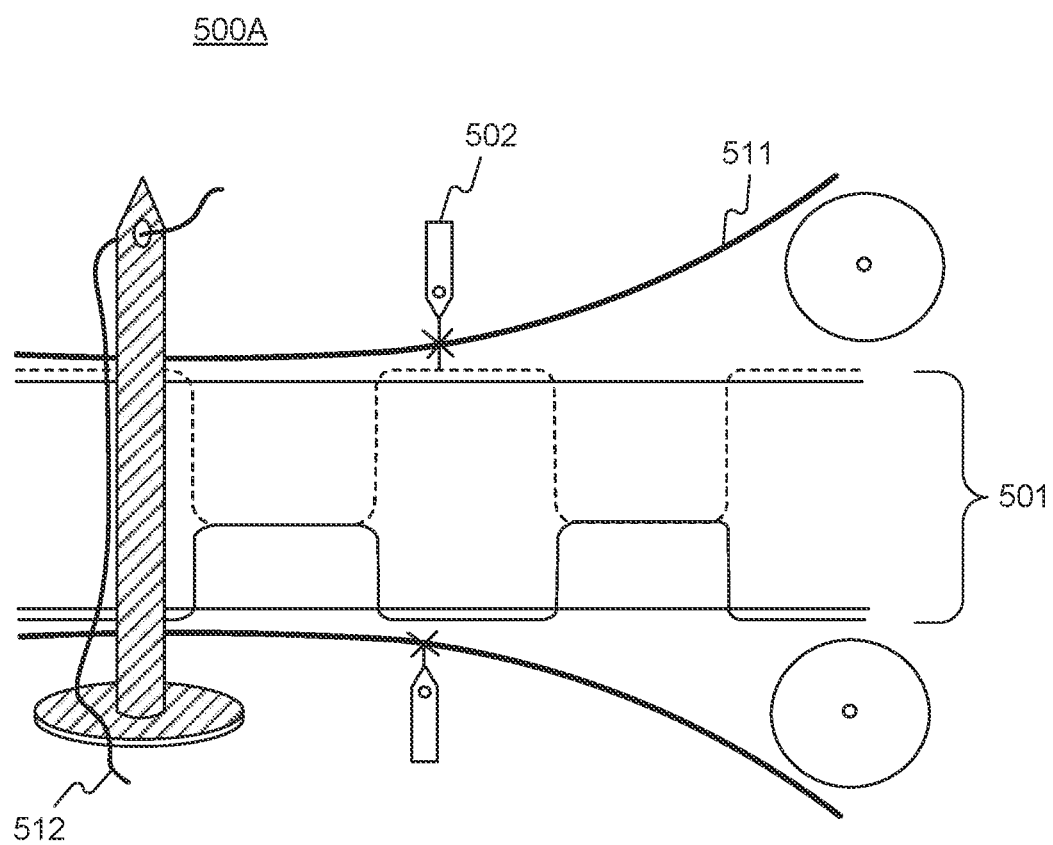
FIG. 5A shows an example arrangement for forming a conductive linkage using heat, in accordance with example embodiments of the disclosure.

FIGS. 5A-5D show different example embodiments of conducive linkages that may be formed onto a fabric layer 501, in accordance with example embodiments of the disclosure. FIG. 5A shows an example arrangement 500A for forming a conductive linkage using heat. For example, a conductive linkage may be formed by applying heat or ultrasonically welding conductive material 511 to layer onto the top and the bottom surfaces of the fabric, using applicators 502. These layers may define regions of added conductive material 511 cut at a specific location using trimmers (not shown), and the top and bottom layers of conductive material 511 may be conductively joined by penetrating the layers with another needle with a conductive thread 512, a conductive pin, a pogo-pin, crimps, etc., within a particular region. A penetrated region may then become the conductive linkage through which a conductive linker (not shown) may connect with a neighboring conductive linkage (not shown) on a different fabric or PCB material (not shown).

Figure 5B:
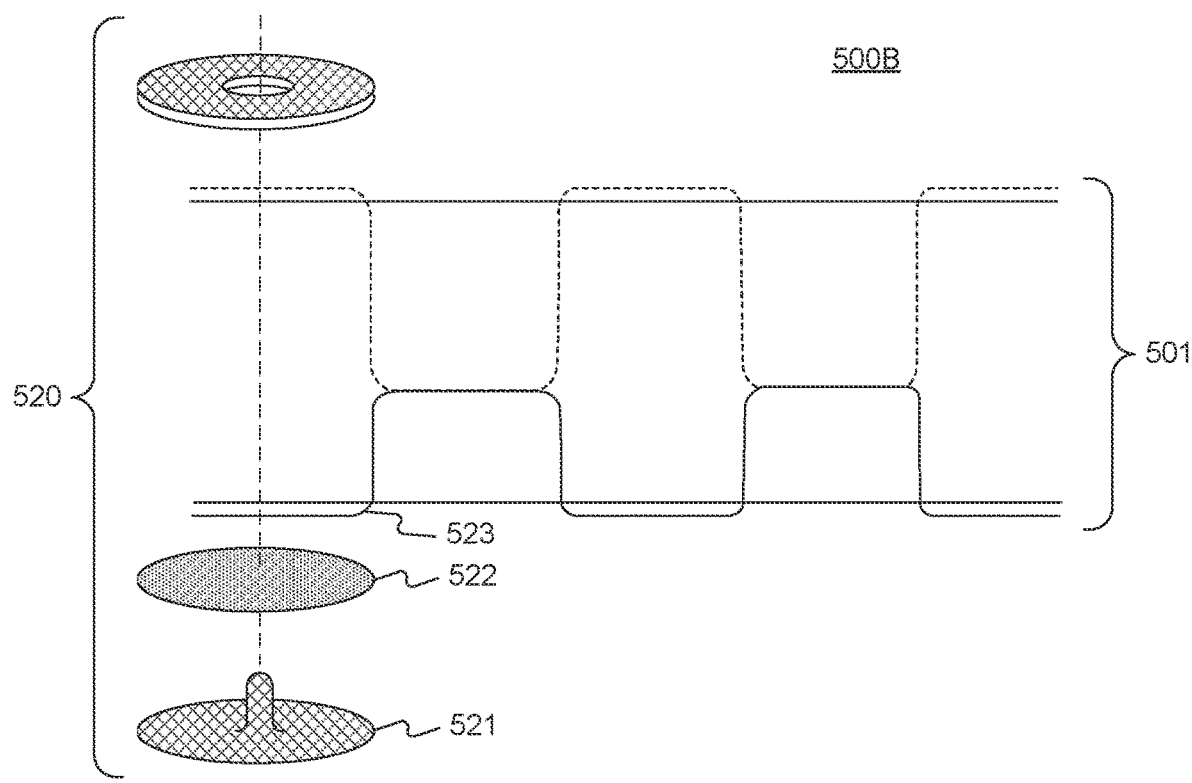
FIG. 5B shows another example arrangement for forming a conductive linkage using a crimp or a rivet, in accordance with example embodiments of the disclosure.

FIG. 5B shows another example arrangement 500B for forming a conductive linkage using a crimp or a rivet 521, in accordance with example embodiments of the disclosure. The rivet 521 may contact an intermediate conductive patch 522 that overlaps an exposed region 523 of a conductive thread. The entire rivet complex 520 is then sandwiched and crimped to penetrate the fabric 501 and create an entire conductive region from the top and bottom of the rivet complex 520, which may then be electrically and mechanically linked to another device (not shown). In some embodiments, the area covered by the intermediate conductive patch 522 and/or the rivet 521 may match or be greater than the width of the exposed region 523. In further embodiments, the diameter of the area covered by the intermediate conductive patch 522 and/or the rivet 521 may be at least twice the width of the exposed region 523.

Figure 5C:
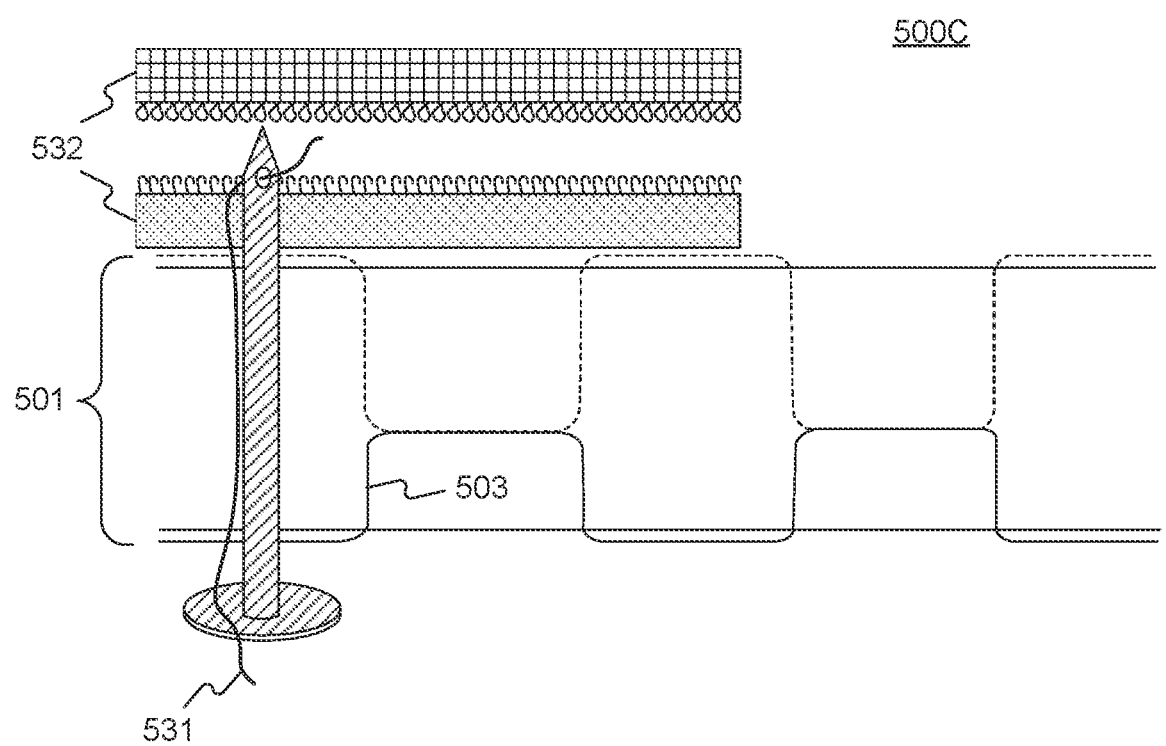
FIG. 5C shows another example arrangement for forming a conductive linkage using a Velcro, in accordance with example embodiments of the disclosure.

Still further, FIG. 5C shows another example arrangement 500C for forming a conductive linkage using a Velcro®=or similar attachment mechanism, in accordance with example embodiments of the disclosure. For example, a separate thread 531 or needle may be used to penetrate the fabric 501 and interface with the embedded conductive thread 503. The fabric 501 may also comprise a conductive layer 532 of Velcro® or similar attachment mechanism, an abrasive, or a knitted fabric, which may also be penetrated by the separate thread 531 or needle. The additional thread or needle 531 may then be crimped on the surface with another module (not shown) in order to expose a larger surface area of conductive material, which may be electrically and mechanically linked to another device (not shown).

Figure 5D:
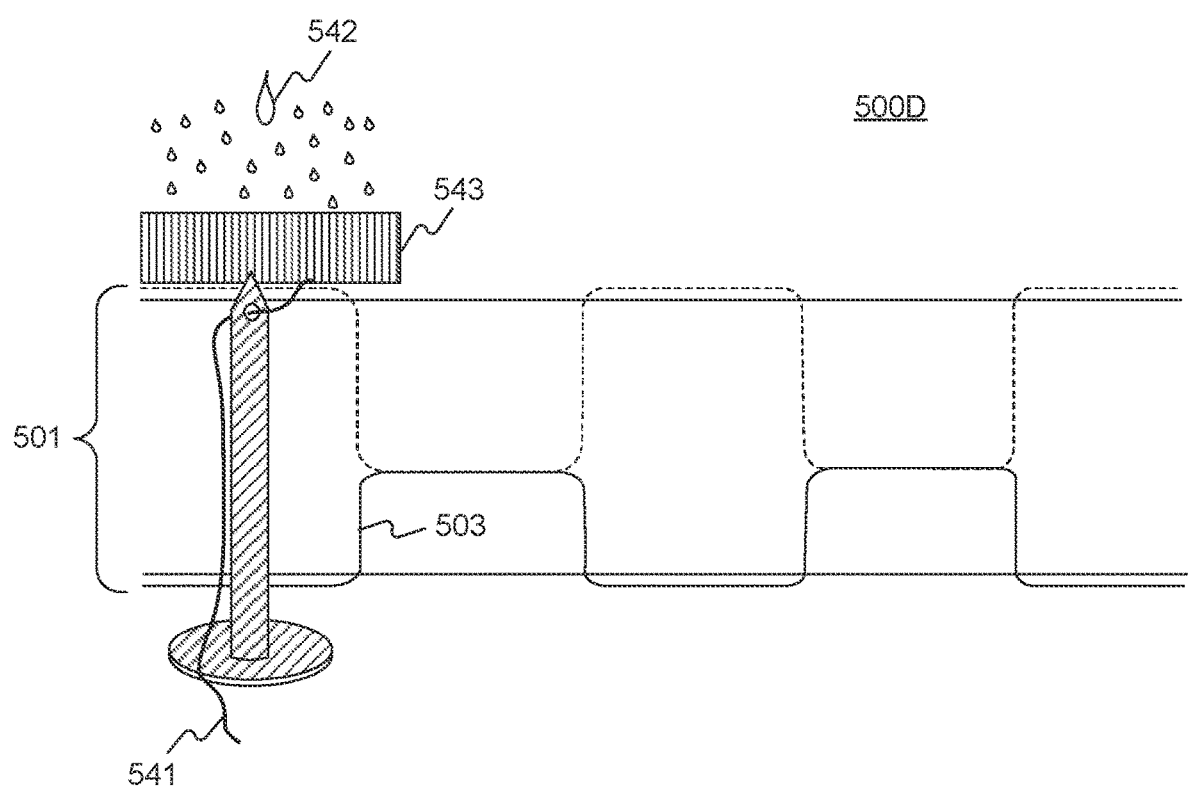
FIG. 5D shows yet another example arrangement for forming a conductive linkage using chemical deposition, in accordance with example embodiments of the disclosure.

FIG. 5D shows yet another example arrangement 500D for forming a conductive linkage using chemical deposition, in accordance with example embodiments of the disclosure. Here, an additional thread 541 or needle may be interfaced with the embedded conductive thread 503 of the fabric 501, in a manner similar to that of FIG. 5C. Unlike the technique shown in FIG. 5C, however, a conductive linkage may be created by applying a chemical or liquid material 542 that cures to form a solid bond 543; whereas the technique shown in FIG. 5C utilizes a mechanical crimping method that forces a mechanical lock of the thread with the layers. This region may then be electrically and mechanically linked to another device.

Figure 6:
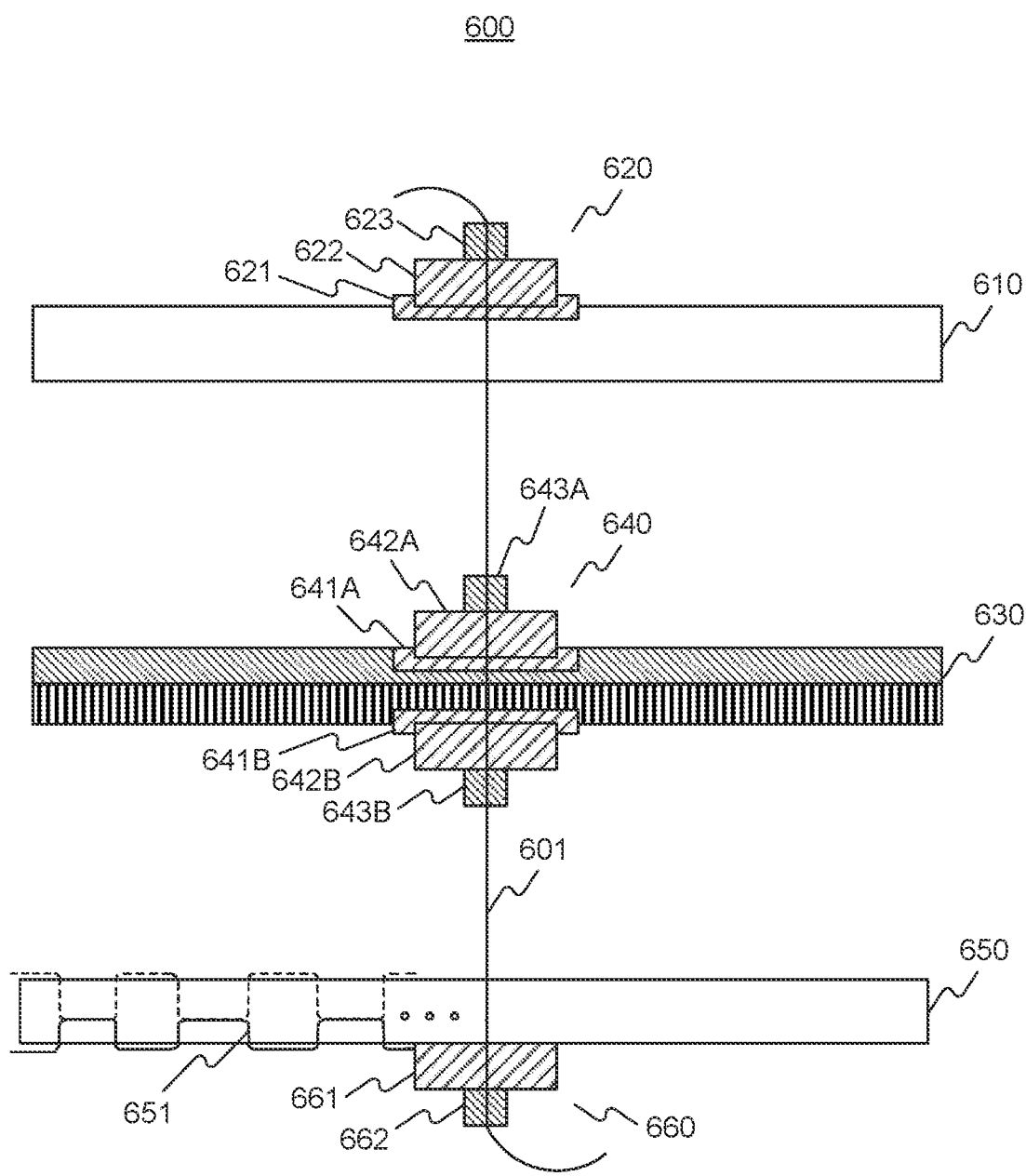
FIG. 6 shows an exploded view of an example fabric-PCB interface of an IC layer, intermediate layer(s), and a fabric layer being conductively bonded through the conductive linker and their respective conductive linkages, in accordance with example embodiments of the disclosure.

FIG. 6 shows an exploded view of an example fabric-PCB interface 600 of an IC layer 610, intermediate layer(s) 630, and a fabric layer 650 being conductively bonded through a conductive linker 601 and their respective conductive linkages 620, 640, and 660, in accordance with example embodiments of the disclosure. Each conductive linkage may be further modified (e.g., at 623, 643A, and/or 662) with electro or mechanical properties to adopt additional features for connection compatibility, material robustness, or general aesthetics. For example, the modifications to the conductive linkages may create additional connection points or modify existing connectors, so that other connection schemes (e.g., magnetic, chemical, mechanical) can be used in addition to the fabric-PCB interface disclosed herein. Considerations such as the thickness of each material, the electromechanical composition of the conductive linkages 620, 640, and 660, and the conductive linker 601, as well as the spatial positioning of the conductive threads 651 impact the connections' signal transmission characteristics, such as signal-to-noise ratio, signal tolerance as a function of mechanical stress, hysteresis, and the like.

In some embodiments, the fabric-PCB interface 600 may include multiple layers of connected electromechanical material. For example, the IC layer 610 may comprise a plastic, synthetic, or PCB material with conductive traces 621 etched on the top or bottom surface. The traces 621 may be modified or bonded with a second layer 622 that comprises a conductive region, which increases the surface area of connection or stabilizes the connection. Next, a third conductive component 623 may be layered on top of the second layer 622, which tethers both the second layer 622 and the conductive linker 601, wherein the conductive linker 601 penetrates and connects all subsequent layers (e.g., the intermediate layer 630 and the fabric layer 650).

Beneath IC layer 610 multiple instances of the same assembly of a plastic, synthetic, fabric, or PCB material may be sandwiched with first layers (e.g., 641A and 641B) of a conductive trace, second layers (e.g., 642A and 642B) that expand and secure the conductive connection with adjacent layers, and third conductive components (e.g., 643A and 643B), which secures the conductive linker 601 to the second layers (e.g., 642A and 642B) and their corresponding assembly (i.e., top and bottom assemblies of the conductive linkage 640).

Next, a fabric layer 650 located below intermediate layer 630 sewn with interlocking conductive and non-conductive material may be bonded to intermediate layer 630. A conductive material 661 is layered on one side of the fabric, which overlaps the exposed conductive regions of the conductive threads 651. A second layer 662 is applied on the conductive material 661 to secure the conductive material 661 and the conductive linker 601, which penetrates throughout the layers in the assembly 600.

Figure 7:
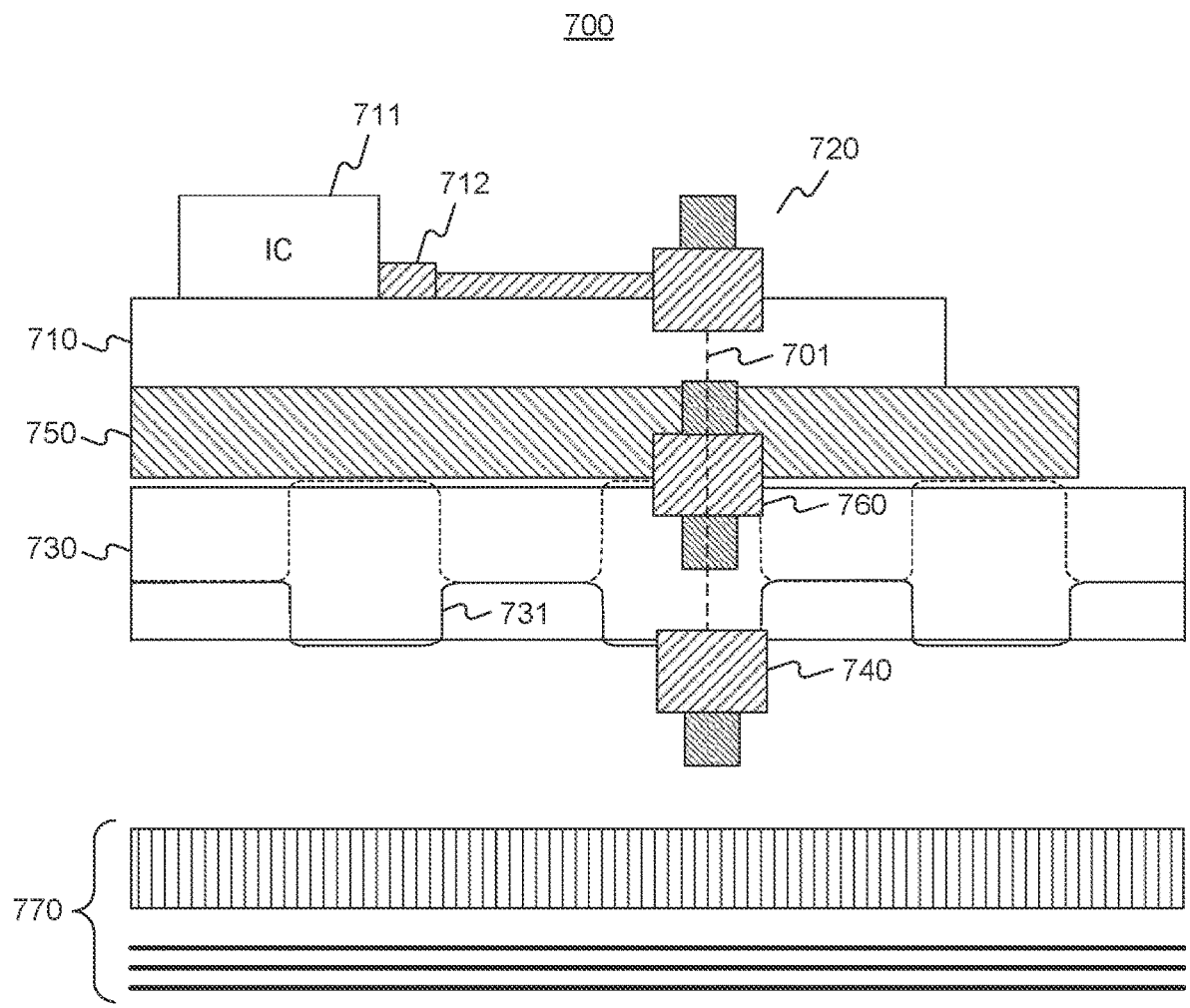
FIG. 7 shows an example fabric-PCB interface of an IC with its conductive linkage, and a fabric layer with conductive thread and its conductive linkage, conductively tethered together with a conductive linker in a vertical position, in accordance with example embodiments of the disclosure.

FIG. 7 shows an example fabric-PCB interface 700 of an IC layer 710 with an IC-layer conductive linkage 720, and a fabric layer 730 with conductive thread 731 and a fabric-layer conductive linkage 740, conductively tethered together with a conductive linker 701 in a vertical position, in accordance with example embodiments of the disclosure. In further detail, the IC layer 710 may comprise an IC 711 with its pinout 712 conductively routed to the IC-layer conductive linkage 720 on the IC layer 710 (e.g., PCB or flexible circuit substrate). The IC-layer conductive linkage 720 may then be electromechanically or electrochemically connected to the fabric layer 730 with the fabric-layer conductive linkage 740 that interfaces with the conductive thread 731 on a bottom surface of the fabric layer 730, on which the conductive thread 731 is exposed. The conductive linker 701 may connect the IC-layer conductive linkage 720 and the fabric-layer conductive linkage 740.

In between the IC layer 710 and the fabric layer 730 may optionally lie one or more intermediate layer(s) 750 of fabric and/or PCB-like material to support mechanical or electrical properties. The intermediate layer(s) 750 may include an insulating fabric, Kapton tape, a thermal protector, or the like. In further embodiments, there may also be an additional conductive linkage 760 on the top surface of the fabric layer 730 to reinforce the mechanical and electrical signal quality of the conductive linker 701 as an electronic signal passes through the intermediate layer(s) 750. Still further, above and below this assembly of layers may also be one or more additional layers 770 for electrical or mechanical reinforcement. The additional layers 770 may include, for example, a spongey material for protection or an electrical sheet for electromagnetic interference shielding. More so, the conductive linkage on each respective layer may be further modified with electro- or mechanical properties to adopt additional features for connection compatibility, material robustness, or general aesthetics.

Figure 8:
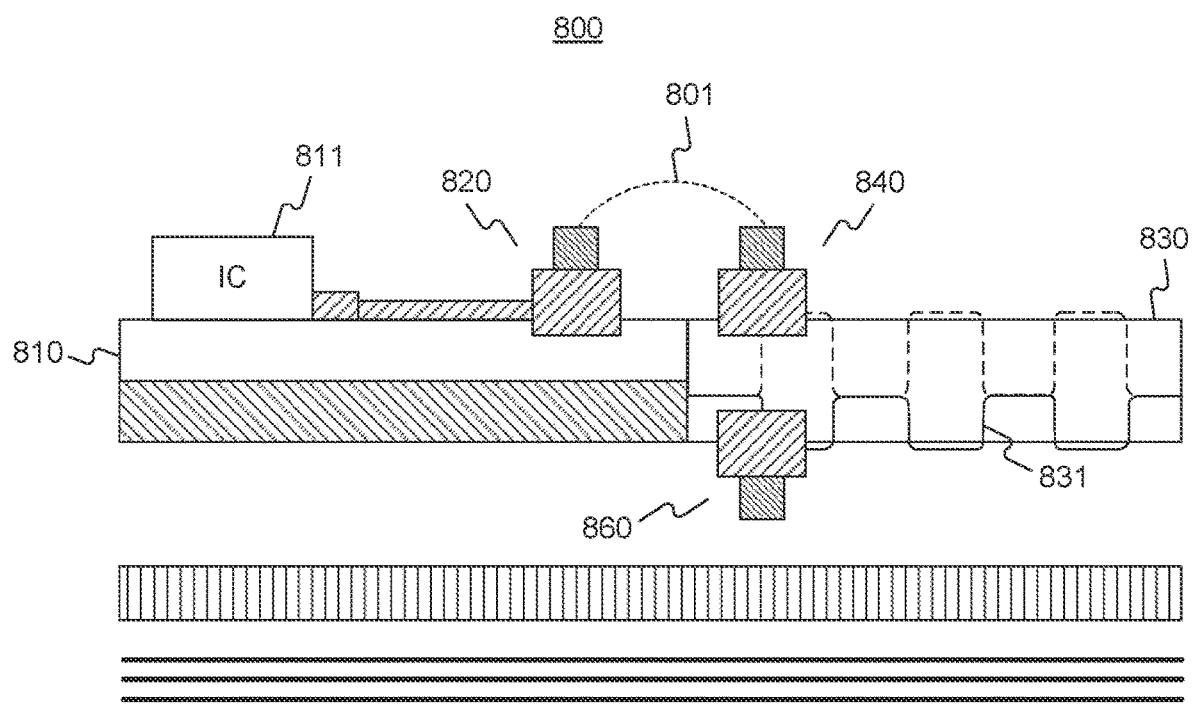
FIG. 8 shows another example fabric-PCB interface of an IC with its conductive linkage, and a fabric layer with conductive thread and its conductive linkages, conductively tethered together with a conductive linker in a horizontal position, in accordance with example embodiments of the disclosure.

FIG. 8 shows another example fabric-PCB interface 800 of an IC layer 810 with an IC-layer conductive linkage 820, and a fabric layer 830 with conductive thread 831 and fabric-layer conductive linkages 840 and 860, conductively tethered together with a conductive linker 801 in a horizontal position, in accordance with example embodiments of the disclosure. FIG. 8 may represent a scheme similar to FIG. 7 for connecting an IC 811 with a fabric with conductive threads, but in a horizontal direction. In this case, the IC-layer conductive linkage 820 is horizontally connected with the conductive linker 801 to the adjacent fabric-layer conductive linkage 840, which is conductively connected to the underneath fabric-layer conductive linkage 860. The underneath fabric-layer conductive linkage 860 may interface with the conductive thread 831 exposed on the bottom side of the fabric layer 830. More so, the conductive linkage on each respective layer may be further modified with electro- or mechanical properties to adopt additional features for connection compatibility, material robustness, or general aesthetics.

Figure 9A:
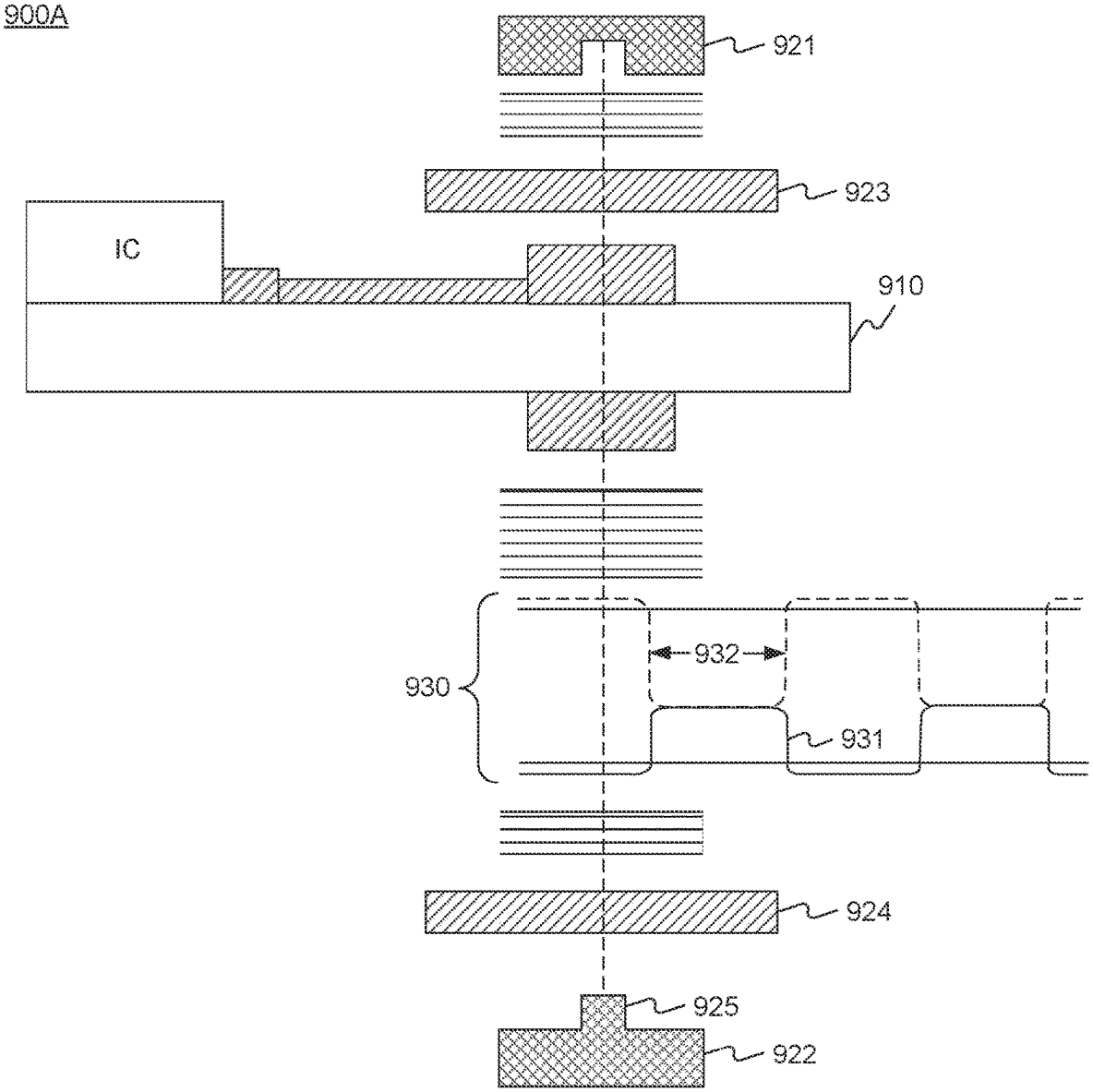
FIG. 9A shows an exploded side view of an example fabric-PCB interface that uses a mechanical mechanism to join two layers, in accordance with example embodiments of the disclosure.
Figure 9B:
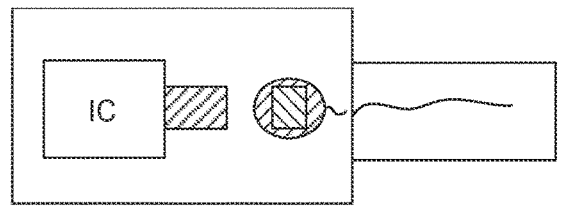
FIG. 9B shows a top-down view of the example fabric-PCB interface shown in FIG. 9A, in accordance with example embodiments of the disclosure.

FIG. 9A shows an exploded side view 900A of an example fabric-PCB interface that uses a mechanical mechanism to join two layers, in accordance with example embodiments of the disclosure. For example, crimps or a snap-like mechanism (e.g., using snaps 921 and 922) may be used to secure conductive linkages of a PCB layer 910 and a fabric layer 930. In some embodiments, area that is covered by the crimps or the snap-like mechanism may match or be greater than the area of an unexposed region 932 of conductive thread 931 in the fabric layer 930. In some embodiments, assembly 900A may further include additional layers of conductive patches 923 and 924 that further expose and create a reliable conductive region on top of the conducive thread 931. In some embodiments, the protruding end 925 of snaps 922 may penetrate all layers in order to secure a continuous electrical and mechanical contact for the connection. FIG. 9B shows a top-down view 900B of the example fabric-PCB interface shown in FIG. 9A, in accordance with example embodiments of the disclosure.

Figure 10A:
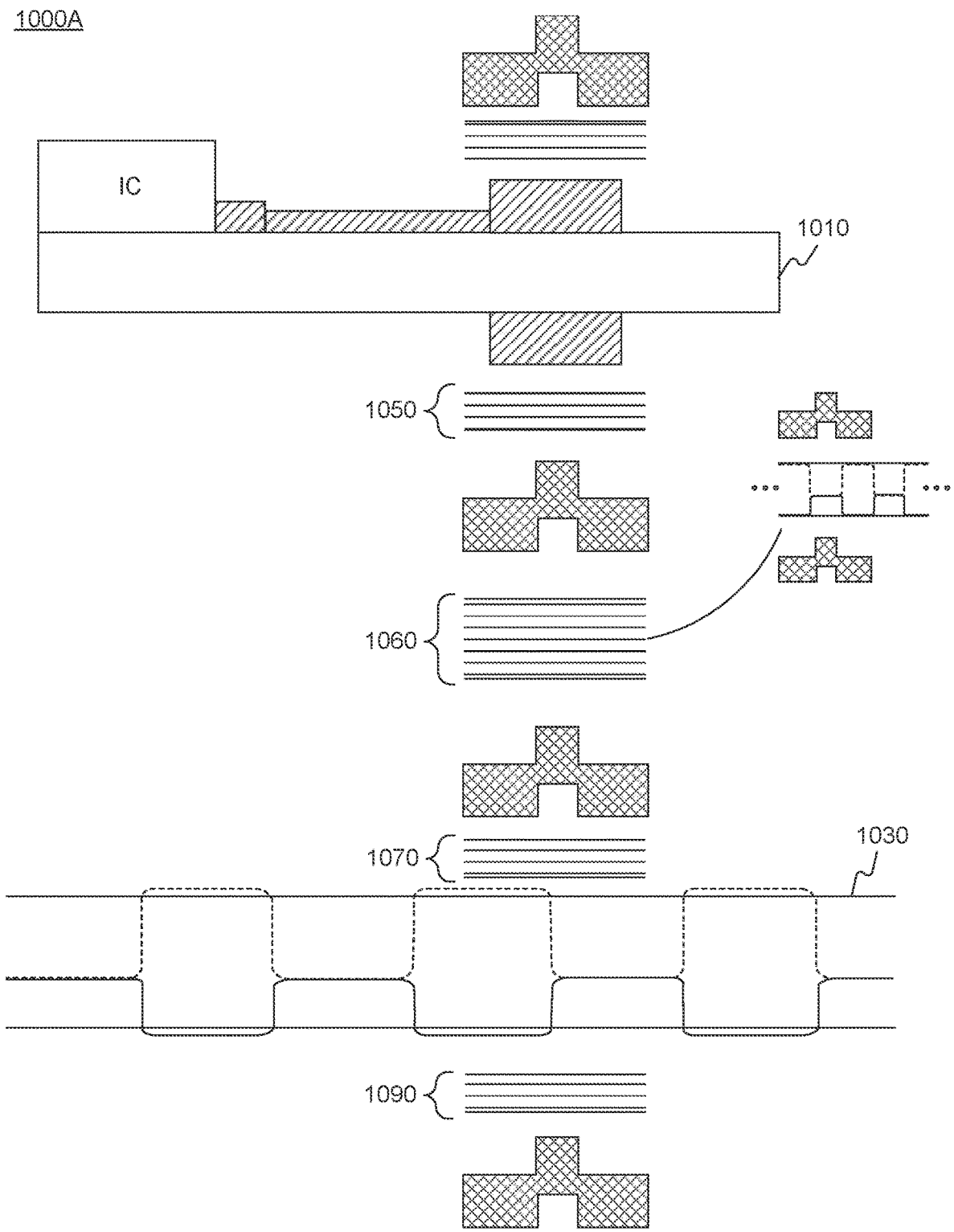
FIG. 10A shows an exploded view of an extension of the example fabric-PCB interface shown in FIG. 9A, in accordance with example embodiments of the disclosure.
Figure 10B:
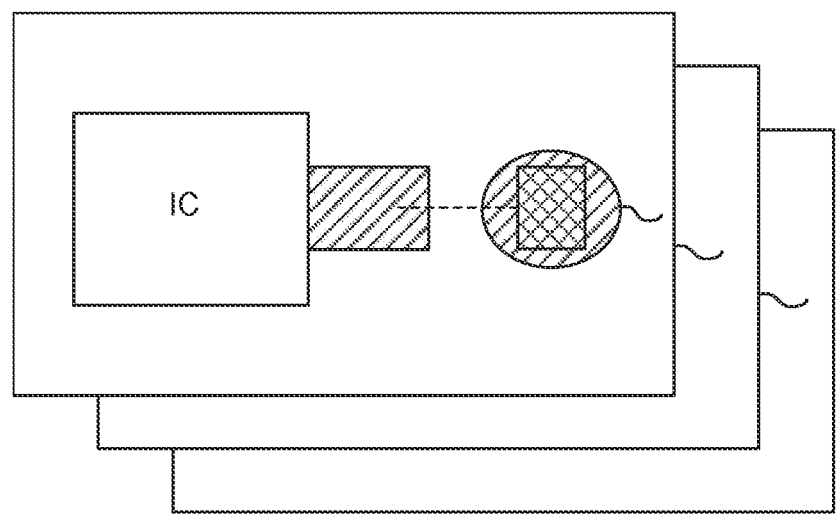
FIG. 10B shows a top-down view of the example fabric-PCB interface shown in FIG. 10A, in accordance with example embodiments of the disclosure.

FIG. 10A is an exploded view 1000A of an extension of the example fabric-PCB interface shown in FIG. 9A, in accordance with example embodiments of the disclosure. Here, crimps or snap-like mechanisms may connect multiple layers of PCB, fabric, or other types of intermediate materials to enhance the electrical or mechanical characteristics of the overall assembly. The sections represented by multiple horizontal lines (e.g., sections 1050, 1060, 1070, and 1090) may represent a combination of one or more layers of PCB, fabric, or other supporting materials (e.g., for comfort, insulation, or reinforcement). In some embodiments, the crimps may penetrate more than one layer of PCB (e.g., PCB layer 1010) and/or fabric with conductive thread materials (e.g., fabric layer 1030). In another embodiment, two or more layers of previously crimped PCB and fabric may then again be crimped and connected with other devices containing a crimped PCB and fabric layer. FIG. 10B shows a top-down view 1000B of the example fabric-PCB interface shown in FIG. 10A, in accordance with example embodiments of the disclosure. While the stacked layers in 1000B are illustrated as being the same size and offset for the purposes of illustrating more than one layer, the size and relative positions of the layers are only provided as examples and are not intended to be limiting.

Figure 11A:
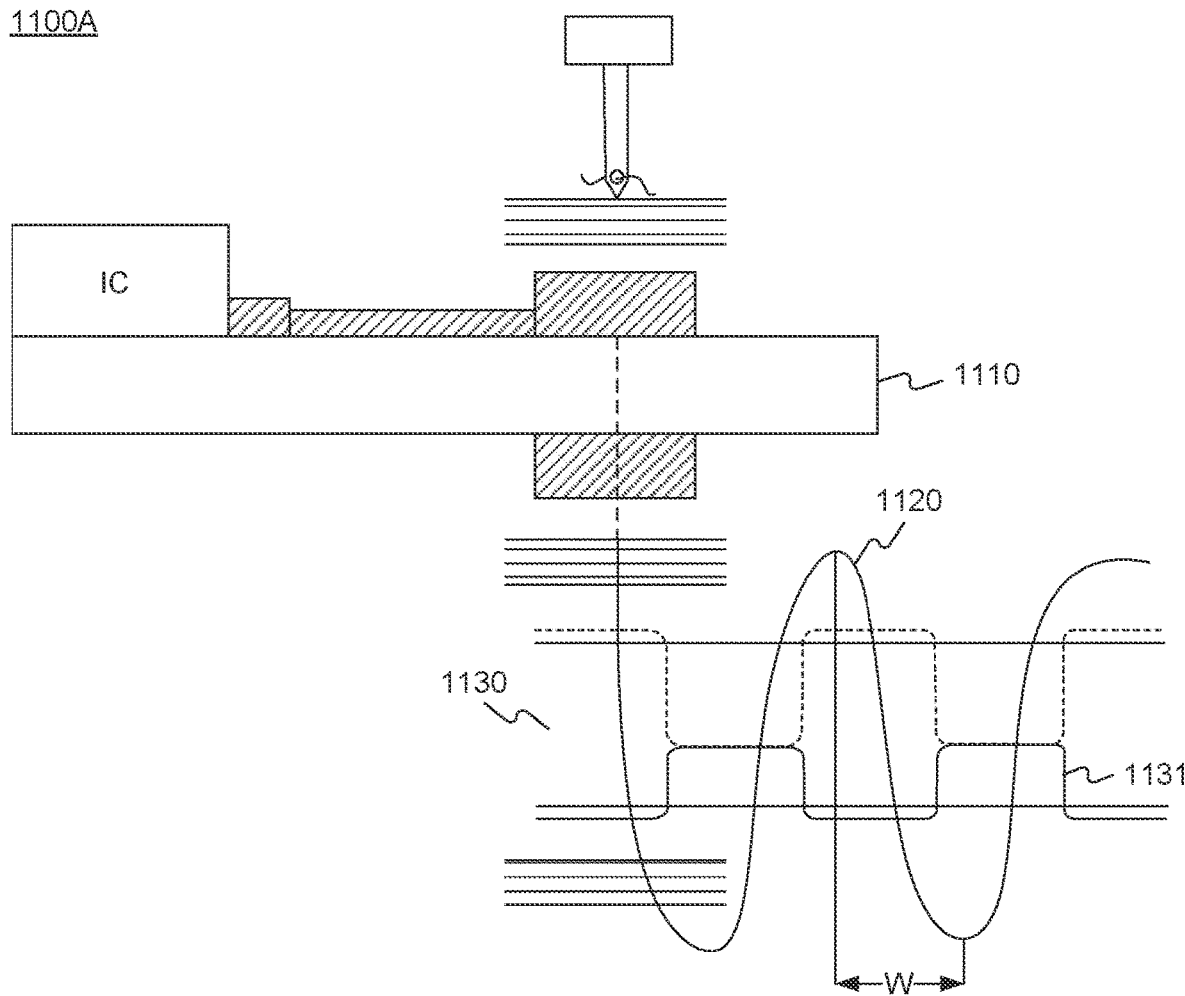
FIG. 11A shows a diagram of an example fabric-PCB interface comprising conductive linkages on a PCB layer and a fabric layer containing a conductive thread, in accordance with example embodiments of the disclosure.

FIG. 11A shows a diagram 1100A of an example fabric-PCB interface comprising conductive linkages (not shown but may be any of the conductive linkages discussed above) on a PCB layer 1110 and a fabric layer 1130 containing a conductive thread 1131, in accordance with example embodiments of the disclosure. The additional conductive sewn thread 1120 may be sewn to link the two conductive linkages of the PCB and the fabric and penetrate the conductive regions of the thread with the same distance, pitch, and width of the original conductive thread 1131 sewn into the fabric layer 1130. In some embodiments, the width of the conductive linkages, in order to secure a reliable patch of conductive area, may match or be greater than the width of the exposed area of the conducive thread 1131 in the fabric layer 1130.

Figure 11B:
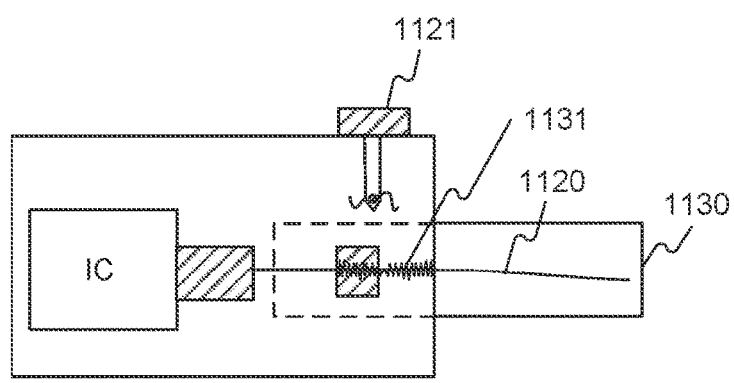
FIG. 11B shows a top-down view of the example fabric-PCB interface shown in FIG. 11A, in accordance with example embodiments of the disclosure.

FIG. 11B shows a top-down view 1100B of the example fabric-PCB interface shown in FIG. 11A, where the conductive linker 1120 of the additional conductive thread from the sewing needle 1121 may also be guided along the same path as the underlying conductive thread 1131 of the fabric layer 1130.

Figure 12A:
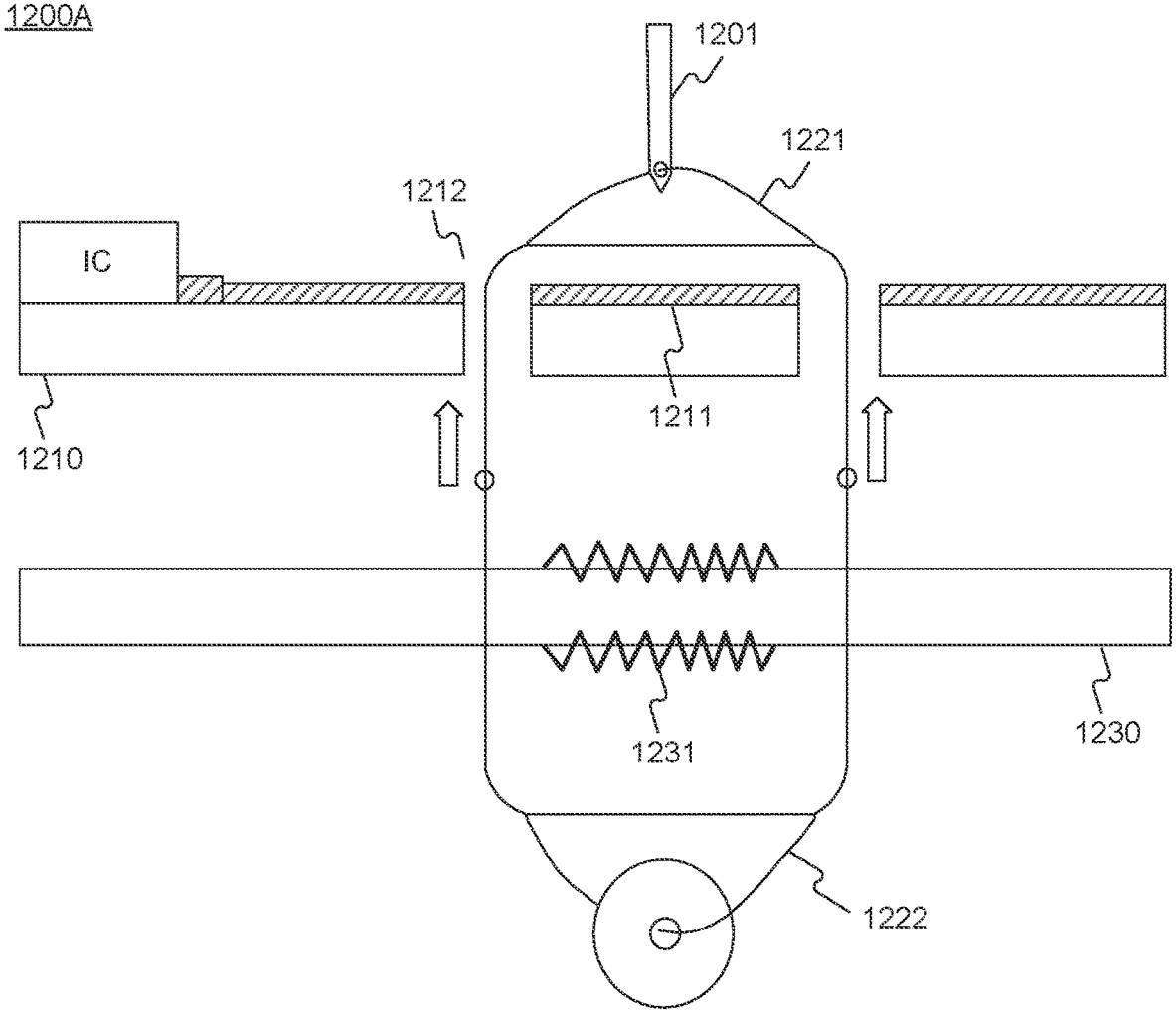
FIG. 12A shows a diagram of an example assembly technique of weaving an embroidered pattern, in accordance with example embodiments of the disclosure.
Figure 12B:
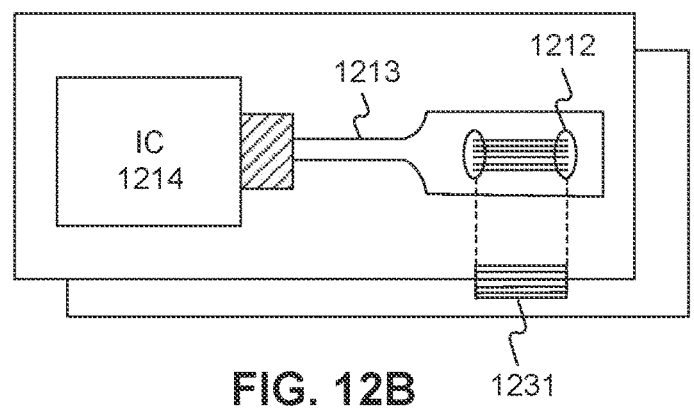
FIG. 12B shows a top-down view of an example assembly formed by the technique shown in FIG. 12A, in accordance with example embodiments of the disclosure.

FIG. 12A shows a diagram 1200A of an example assembly technique of weaving an embroidered pattern. Here, an embroidered pattern is sewn on top of an existing PCB-layer conductive linkage 1211 on a PCB layer 1210 and a fabric-layer conductive linkage 1231 (e.g., a conductive patch or an embroidery of conductive thread) on a fabric layer 1230. Both the PCB-layer conductive linkage 1211 and the fabric-layer conductive linkage 1231 may have openings 1212 or may be semi-porous to allow a needle 1201 to penetrate the layers and tie a top-thread 1221 and a bottom-thread 1222 during sewing. Under the right tension, the top-thread 1221 and bottom-thread 1222 may be pulled to form a taut bond that ties both the PCB-layer conductive linkage 1211 and the fabric-layer conductive linkage 1231. FIG. 12B shows a top-down view 1200B of an assembly formed by the technique shown in FIG. 12A, in which the conductive trace 1213 that leads from the IC 1214 is electrically connected a region with a conductive patch 1231 and openings 1212, forming the PCB-layer conductive linkage 1211.

Figure 13A:
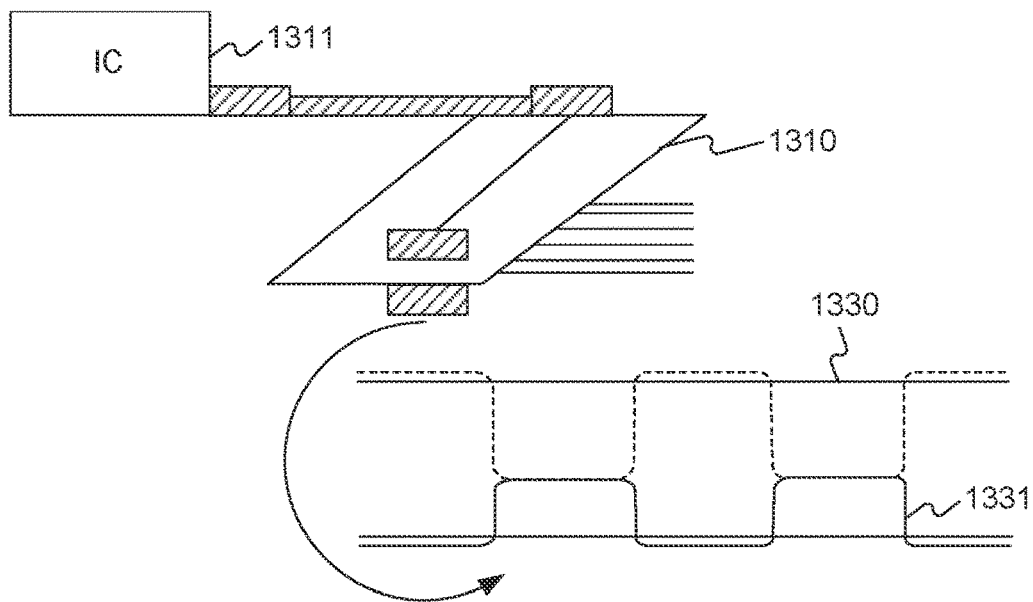
FIGS. 13A and 13B show diagrams of another example assembly technique of folding a PCB substrate, in accordance with example embodiments of the disclosure.
Figure 13B:
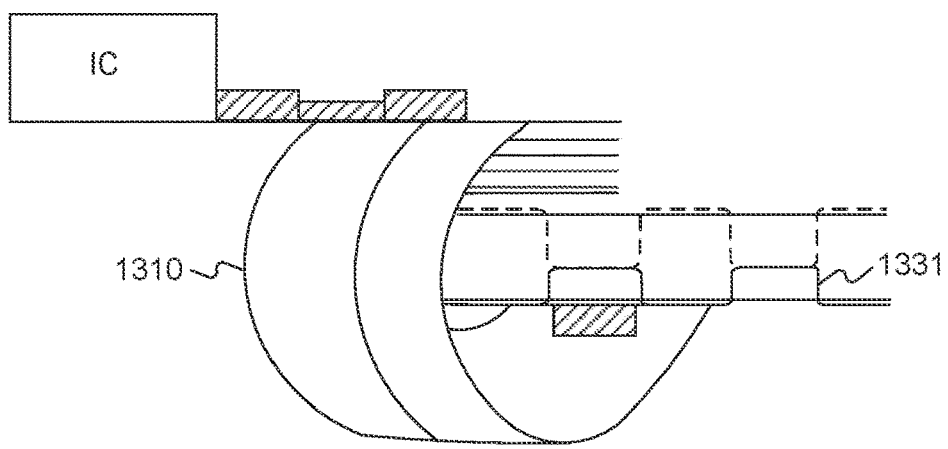

FIGS. 13A and 13B show diagrams of another example assembly technique of folding a PCB substrate 1310, in accordance with example embodiments of the disclosure. Here, the PCB substrate 1310 of an IC 1311 may be folded to serve as a conductive linker that couples to a conductive linkage (not shown) of a fabric layer 1330. In this example, since a conductive thread 1331 of the fabric layer 1330 is exposed on the bottom surface, the fold from the PCB substrate 1310 may be configured to wrap to the fabric layer 1330, which may be configured to be the lowest layer. FIG. 13B shows the fully folded connection, where the PCB substrate 1310 is folded to be connected to the conductive thread 1331.

Figure 13C:
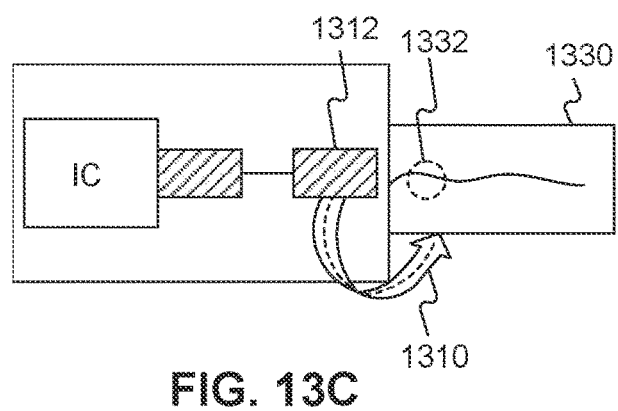
FIG. 13C shows a top-down view of an example assembly formed by the technique shown in FIG. 13A, in accordance with example embodiments of the disclosure.

FIG. 13C shows a top-down view of an example assembly formed by the technique shown in FIG. 13A, where region 1332 illustrates the bottom surface of the fabric layer 1330 that is connected to the PCB substrate 1310. Alternatively, this folding mechanism may occur the other way around, in which the fabric layer is folded to wrap onto a conductive linkage 1312 on the PCB substrate 1310. Once folded, the connection may be secured either chemically, mechanically, or magnetically.

Figure 14:
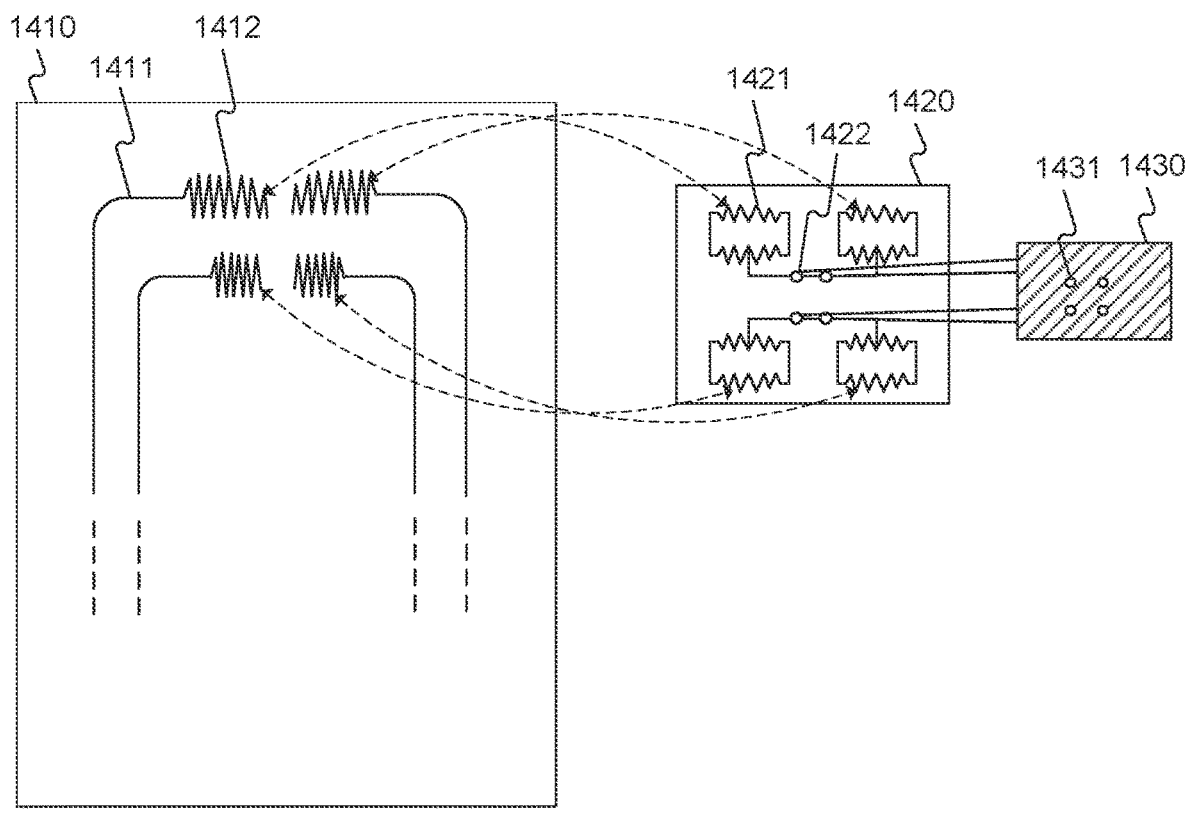
FIG. 14 shows a top-down view of an example electrical device with a fabric-PCB interface, in accordance with example embodiments of the disclosure.

FIG. 14 shows a top-down view of an example electrical device 1400 with a fabric-PCB interface shown in FIGS. 1-13, in accordance with example embodiments of the disclosure. Here, conductive threads (e.g., 1411) of a fabric layer 1410 may terminate at four separate regions including embroidered conductive patches (e.g., 1412). These conductive patches (e.g., 1412) may then be crimped or otherwise electromechanically bonded onto corresponding crimped areas (e.g., 1421) of an intermediate layer 1420, which may be more amenable for interfacing with a PCB. Intermediate layer 1420 may route one or more of the connected crimped areas (e.g., 1421) to one or more of four corresponding terminals (e.g., 1422). The one or more terminals may be soldered, pinned, or magnetically attached, for example, to an electronic device 1430. In some embodiments, electronic device 1430 may comprise the same topology of connectors (e.g., 1431) as intermediate layer 1420. In some embodiments, intermediate layer 1420 (including, for example, a combination of using a conductive linkages and linkers) is configured to interface with the conductive fabric (i.e., the fabric layer 1410), so that the conductive patches (e.g., 1412 may be converted into a more contactable PCB layout (i.e., arrangement of crimped areas (e.g., 1421)) to which the electronic device 1430 may attach.

Figure 15A:
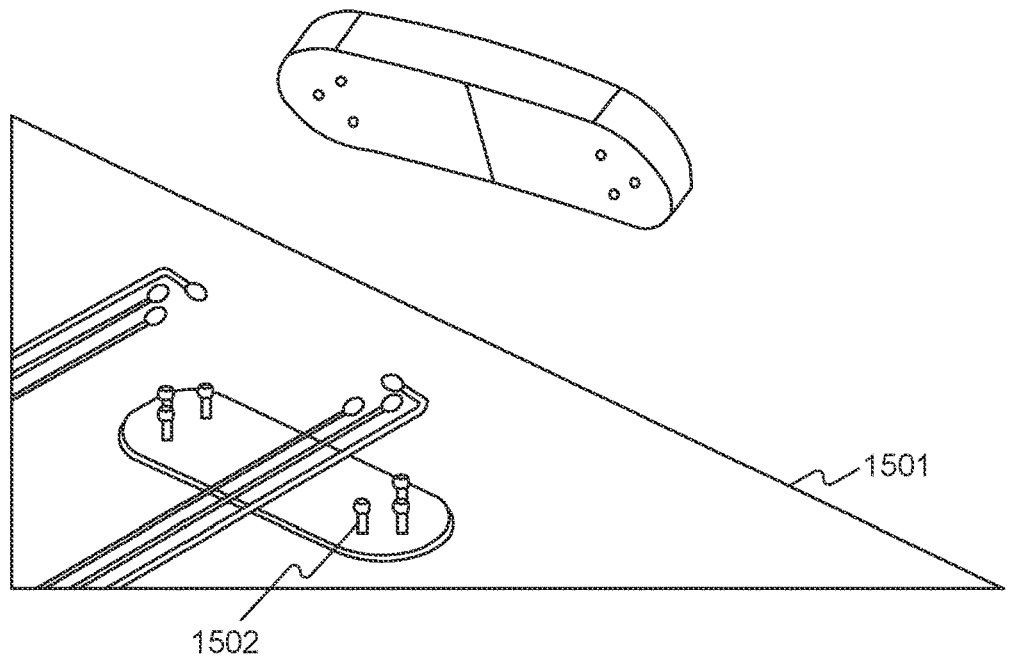
FIG. 15A shows a portion of an example device, in accordance with example embodiments of the disclosure.
Figure 15B:
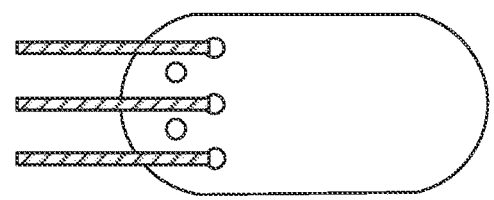
FIG. 15B shows different example configurations conductive threads may be sewn to connect to pinouts, in accordance with example embodiments of the disclosure.
Figure 15B:
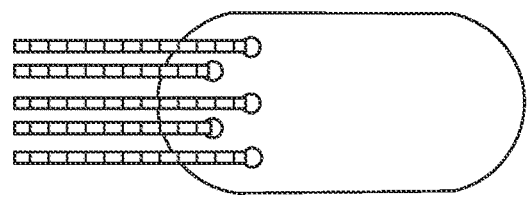
Figure 15B:
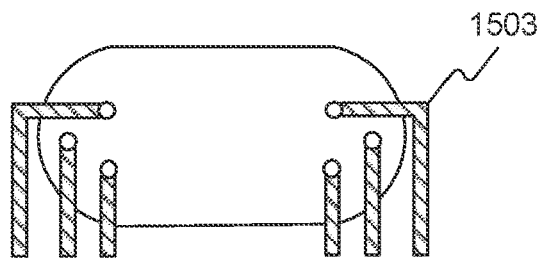

FIG. 15A shows a portion of an example device 1500A with six pinouts 1502 that interface with a layout of conductive threads (not shown) embedded within a fabric 1501. The two components may be bonded together using a crimping mechanism (not shown), where a lower layer of conductive material and headers may be used to penetrate the fabric 1501 and contact the conductive threads while also locking into the pinouts 1502 of the device. FIG. 15B shows different example configurations of conductive threads 1503 that may be sewn to connect to the pinouts 1502 of the device. Pin location, pin pattern, routing mechanism, and routing pattern may be altered depending on factors such as stitch path, linkage material, and types of substrates used.

FIGS. 16-19 show graphs of empirical data that compare performances of different connections in example fabric-PCB interfaces fabricated using conventional and currently disclosed connection techniques, such as sewn, crimped, Velcro, magnetic, inks, conductive sheets, or conductive adhesives. In some embodiments, the connections may electrically couple a fabric-based circuit (e.g., FIG. 3A) and a PCB-based circuit (e.g., FIG. 3B), consistent with various embodiments disclosed herein.

Figure 16:
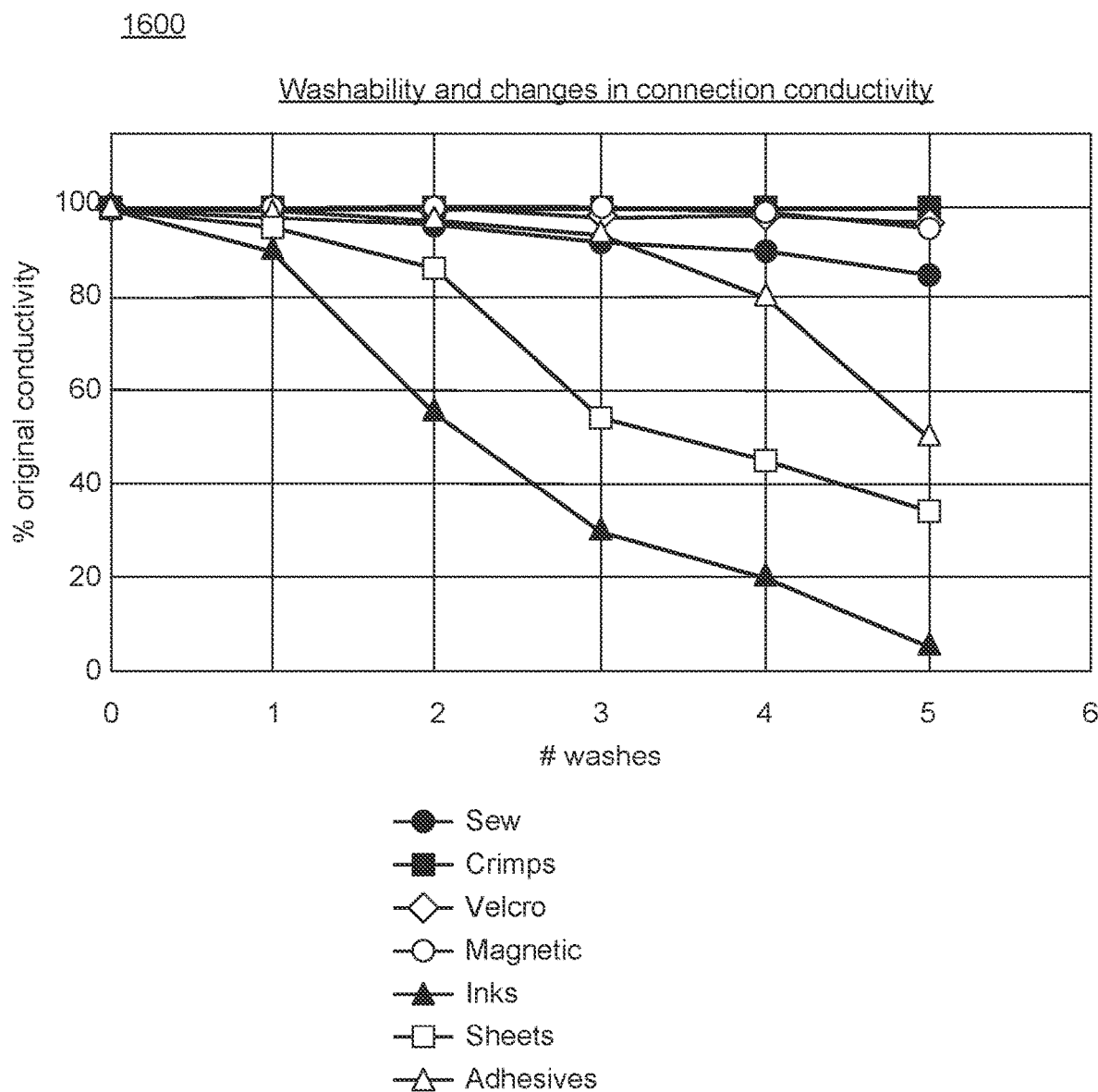
FIG. 16 shows an example plot of signal integrity of connections in example fabric-PCB interfaces fabricated using different connection techniques, in accordance with example embodiments of the disclosure.

FIG. 16 illustrates an example plot 1600 of signal integrity of connections in example fabric-PCB interfaces fabricated using different connection techniques, as measured by the percent conductivity after a number of wash cycles. As can be seen in chart 1600, connections made using inks and sheets may tend to deteriorate faster than sewn, crimped, magnetic, or Velcro connections.

Observations during empirical studies have shown that the chemical coatings of inks and sheets may deteriorate or flake during washing and drying cycles, thus reducing the connection conductivity and limiting signal transmission while increasing vulnerability to stray noise. In addition, while inks and sheets employ both adhesive, chemical, and mechanical bonding mechanisms onto the fabric substrate, sewn, crimped, Velcro, and magnetic connections primarily rely on mechanical forms of bondage. Adhesive and chemical forms of bonding, typically found in conventional connections, may be more susceptible to washing and drying damages due to solvent and chemical incompatibility, therefore reducing connection lifespan which may result in drops in signal and increase in noise.

Figure 17:
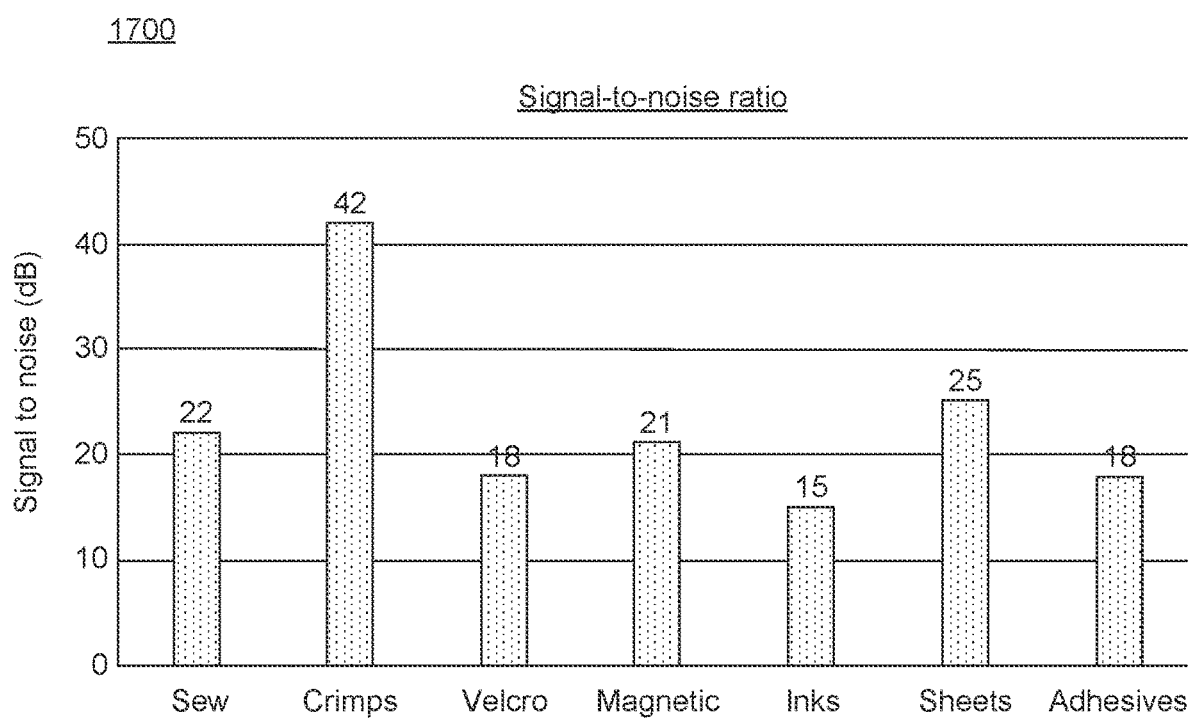
FIG. 17 shows an example plot of signal-to-noise ratio in example fabric-PCB interfaces fabricated using different connection techniques, in accordance with example embodiments of the disclosure.

FIG. 17 illustrates an example plot 1700 of signal-to-noise ratio (SNR) in example fabric-PCB interfaces fabricated using different connection techniques. The connections utilizing conductive bonding of crimps and conductive sheets had the highest SNR. This characteristic may be due to the large surface areas and planar contacts crimps and sheets have on both the fabric-based circuit and the PCB-based circuit. Sewn, Velcro, magnetic, inks, and certain conductive adhesives largely had similar SNR, implying that functional usage of each connection type may be interchangeable and the primary difference may be their physical-form factor.

Figure 18:
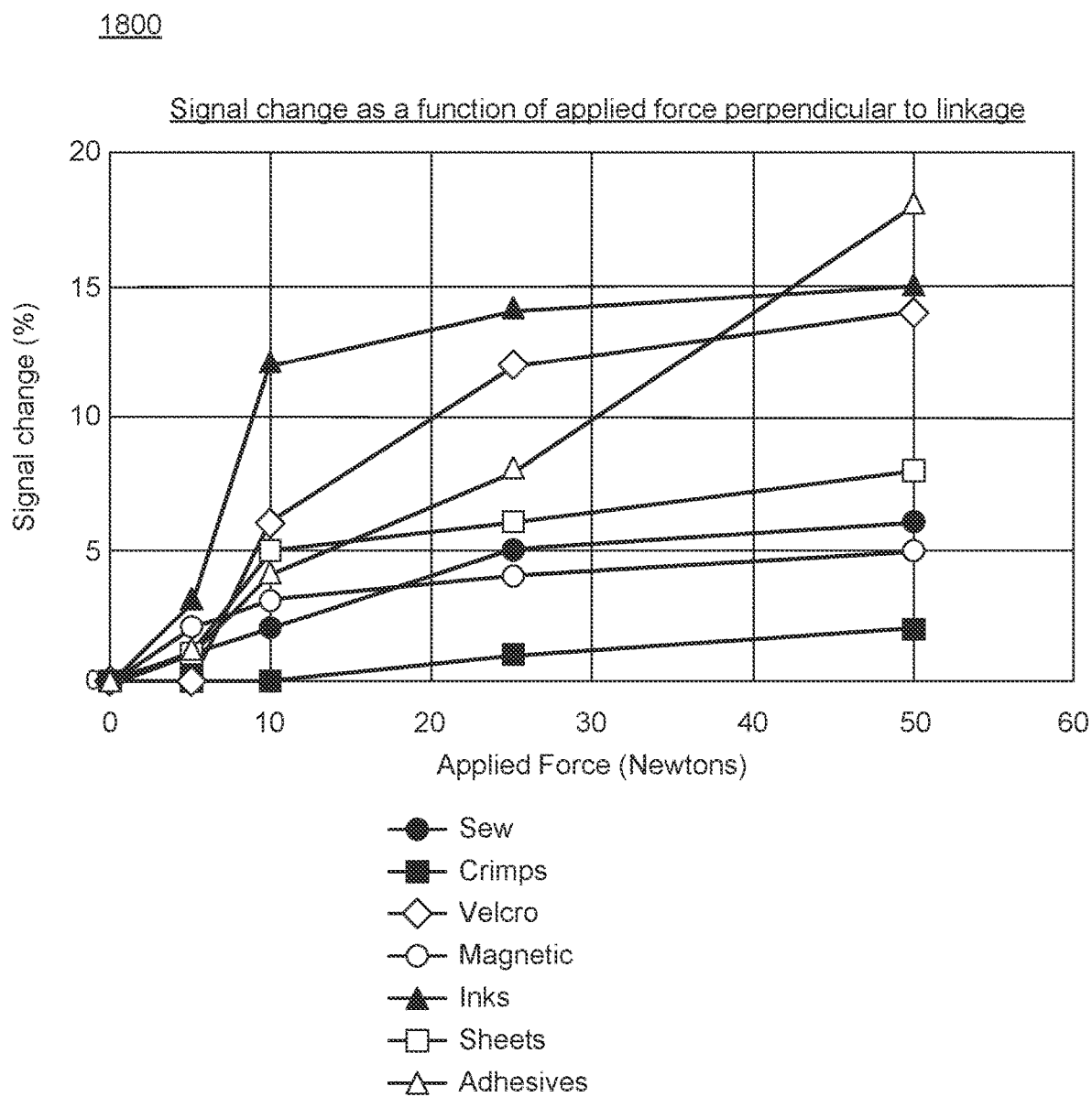
FIG. 18 shows an example plot of signal change relative to mechanical stress in example fabric-PCB interfaces fabricated using different connection techniques, in accordance with example embodiments of the disclosure.
Figure 19:
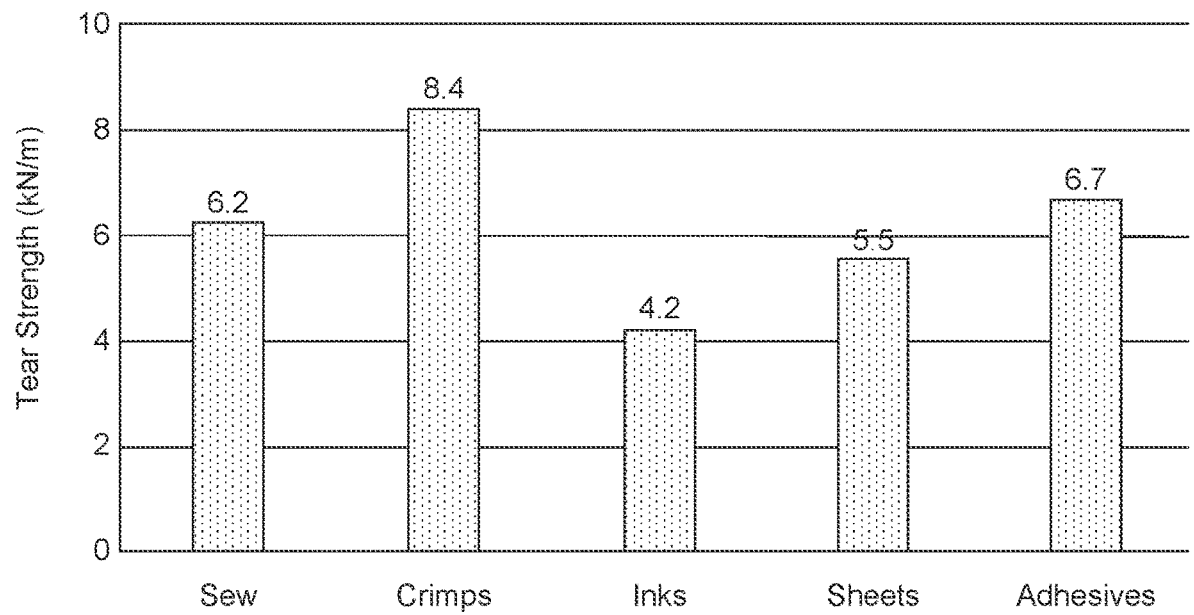
FIGS. 19A and 19B show example plots of mechanical properties in example fabric-PCB interfaces fabricated using different connection techniques, in accordance with example embodiments of the disclosure.
Figure 19:
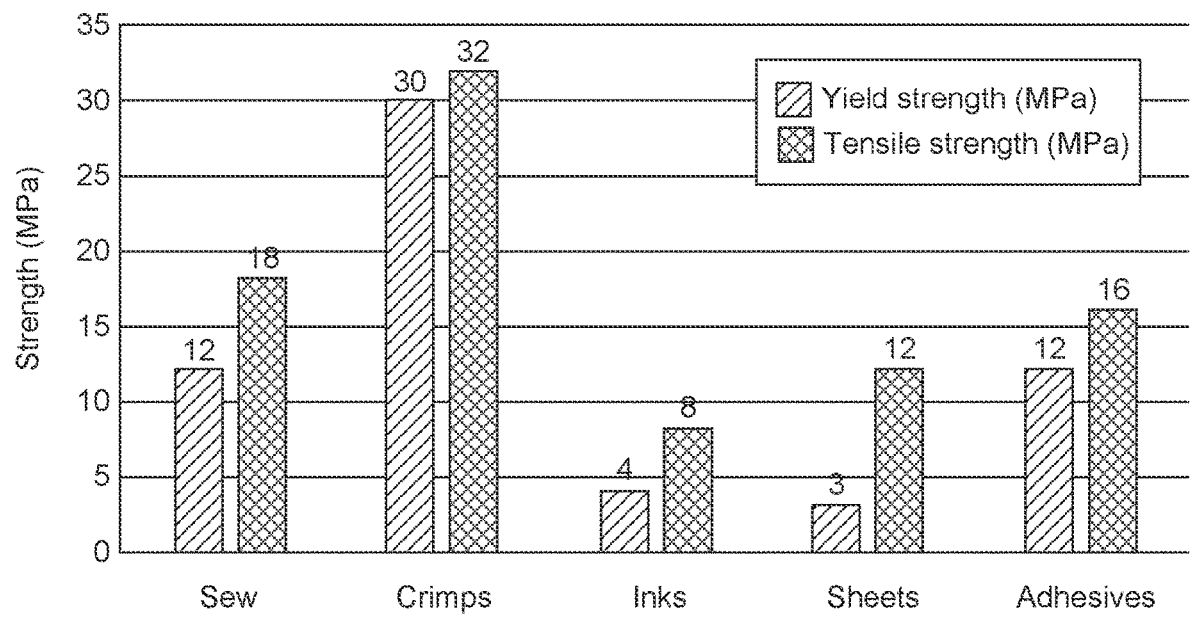

FIG. 18 illustrates an example plot 1800 of signal change relative to mechanical stress in example fabric-PCB interfaces fabricated using different connection techniques. Mechanical stress can introduce changes in length, width, and thickness of the connection material, thereby changing the materials' resistivity. Normally, an increase in length and width may increase resistivity, and an increase in thickness may reduce resistivity. These resistive changes may alter the signal strength. FIG. 18 illustrates the magnitude of such signal change.

As shown in plot 1800, adhesives may create the greatest signal change with respects to mechanical deformation, while inks and Velcro may largely plateau above several hundred Newtons. Such a significant change in the signal change for adhesives may be due to the thin chemical layering in such connections, which may be more susceptible to larger deltas in the length, width, and thickness dimensions. The connection materials most resistant to mechanical change may be crimped, magnetic, and sewn connections, which may be primarily due to their mechanical robustness.

FIGS. 19A and 19B show example plots of mechanical properties in example fabric-PCB interfaces fabricated using different connection techniques. For example, the example plot 1900A shows mechanical robustness as measured by tear strength and the other example plot 1900B shows the tensile strength and yield strength resulting from the various connection techniques.

Crimped, adhesive, and sewn connection types may have the highest threshold for yield and tensile strength when pulled in the horizontal and perpendicular directions. These traits may be due to how those connection types are mechanically attached. The mechanical properties of adhesives may be ultimately defined by the substrate to which they are attached, e.g., a piece of textile as in a fabric-based circuit. Sewn and crimped connections may have higher yield and tensile strengths because of their physical connection into the fabric-based circuit. On the other hand, inks and sheets may have lower yield and tensile strengths as the chemicals begin to deteriorate, either by flaking or cracking, and dissociate with the fabric-based circuit. These chemically induced changes that can be exacerbated by mechanical movements (e.g., repeated exertions of force through folding, moving, twisting, etc.) may be irreversible.

Figure 20A:
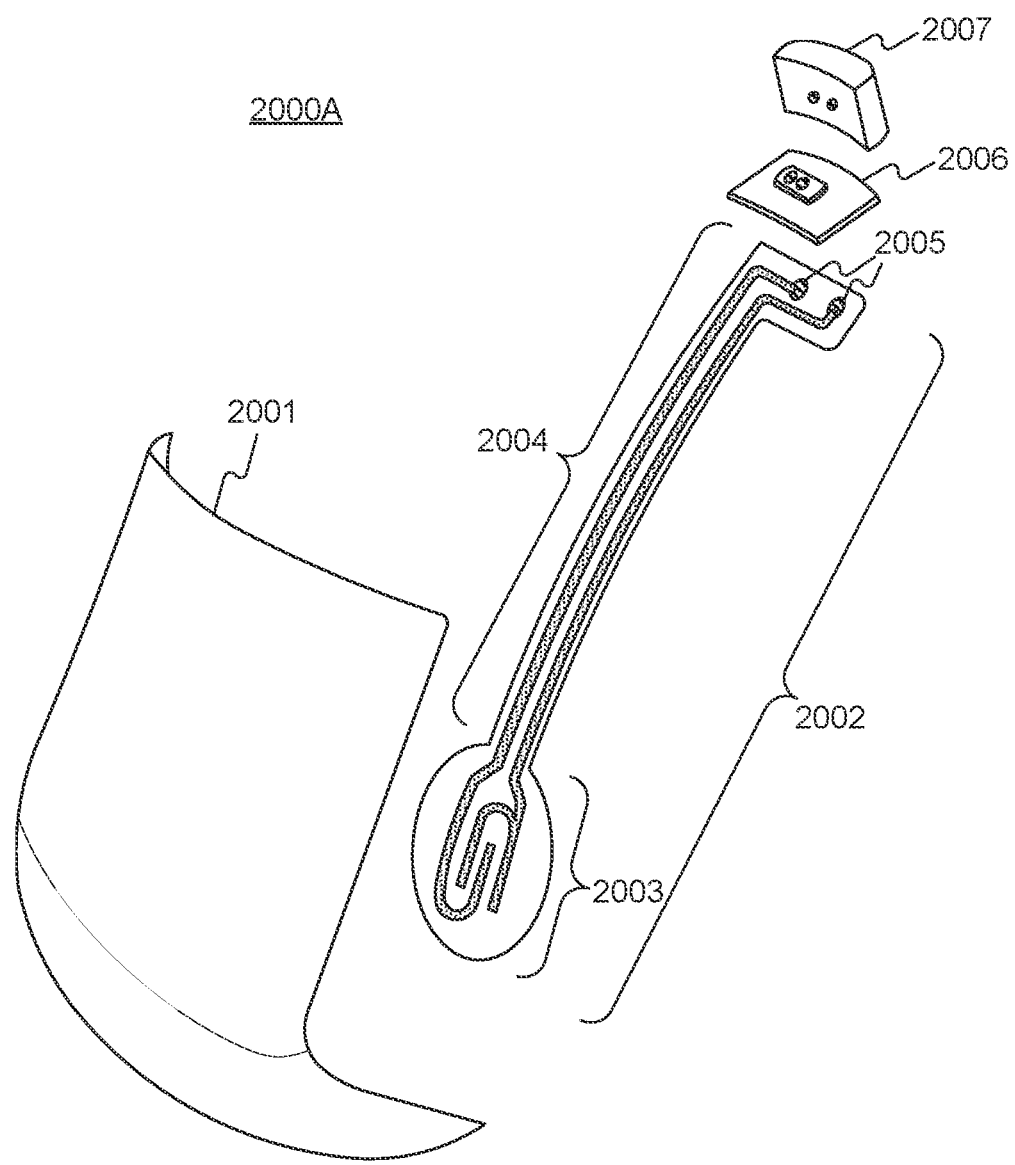
FIG. 20A shows an example set of components that make up a fabric sensing device, in accordance with example embodiments of the disclosure.

FIG. 20A shows an example set of components that make up a fabric sensing device 2000A. Fabric sensing device 2000A may include a textile good 2001 into which the sewn material may be embedded. Fabric sensing device 2000A may also include a fabric component 2002 comprising a fabric sensor 2003 and signal wires 2004, both of which include conductive threads. In some embodiments, one or more conductive threads form fabric sensor 2003 and signal wires 2004. One, two, three, or more conductive threads may form fabric sensor 2003 and signal wires 2004. In some embodiments, the same conductive threads form fabric sensor 2003 and signal wires 2004. In other embodiments, different conductive threads may form fabric sensor 2003 and signal wires 2004. In some embodiments, fabric sensor 2003 may be located at a first end of fabric component 2002. Conductive wires 2004 may extend from the first end of fabric component 2002 to a second end of fabric component 2002.

Figure 20B:
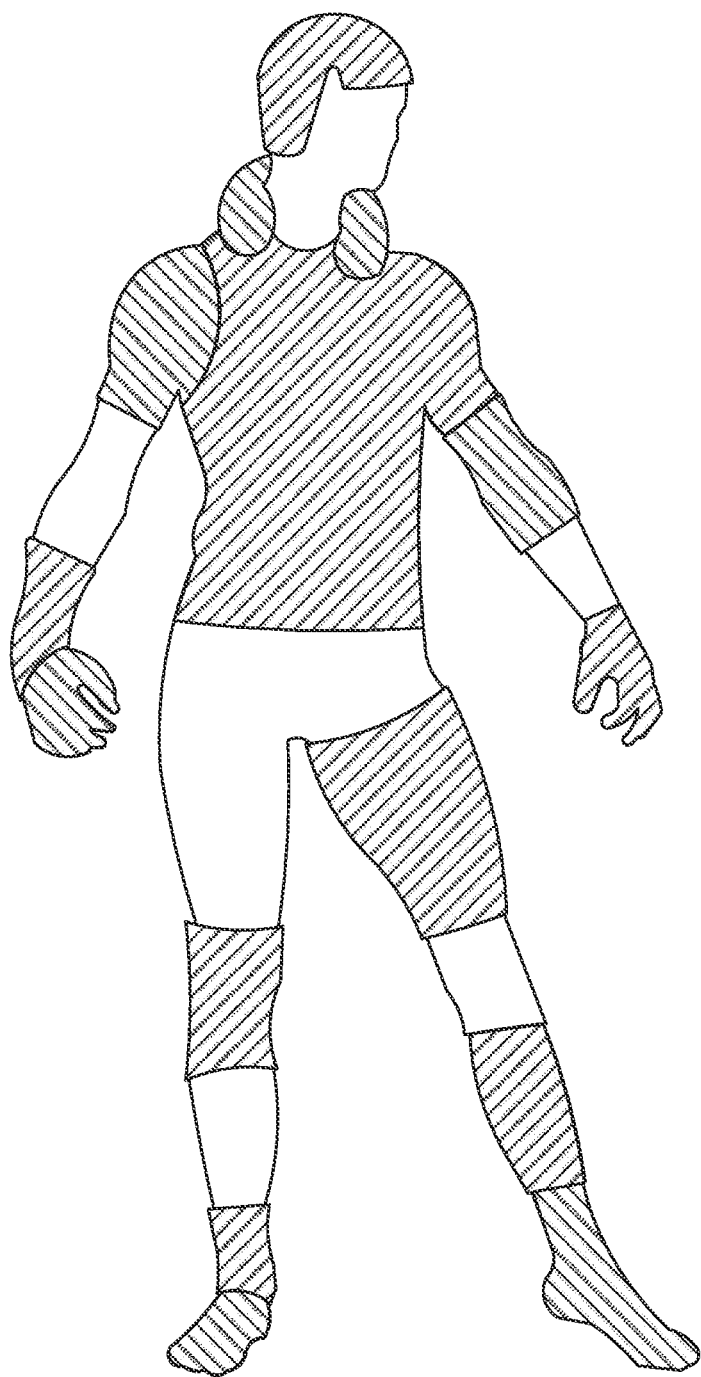
FIG. 20B shows how the example set of components shown in FIG. 20A may be modularly used on a range of apparel on a human body in accordance with example embodiments of the disclosure.

Fabric sensing device 2000A may also include one or more connectors 2005, including male or female connectors that electrically bond onto the conductive threads of the fabric component 2002. Connectors 2005 may be configured at the second end of fabric component 2002, opposite fabric sensor 2003. In some embodiments, connectors 2005 may be affixed to one or more conductive threads acting as one or more conductive wires 2004 at the second end of fabric component 2002. In some embodiments, connectors 2005 may be affixed to another portion of conductive wires 2004. Fabric sensing device 2000A may include one or more intermediate connectors 2006 to be attached to an electronic module 2007, so that the electronic module 2007 may electromechanically connect to the one or more connectors 2005 of fabric component 2002. In some embodiments, fabric sensing device 2000A may comprise one or more of each component, such that one fabric sensing device may have two or more fabric components, which in turn may comprise more than one fabric sensors. FIG. 20B illustrates how the example set of components shown in FIG. 20A may be modularly used on a range of apparel on a human body, where each discrete section may represent a set of components comprising one or more fabric sensing devices.

Figure 21:
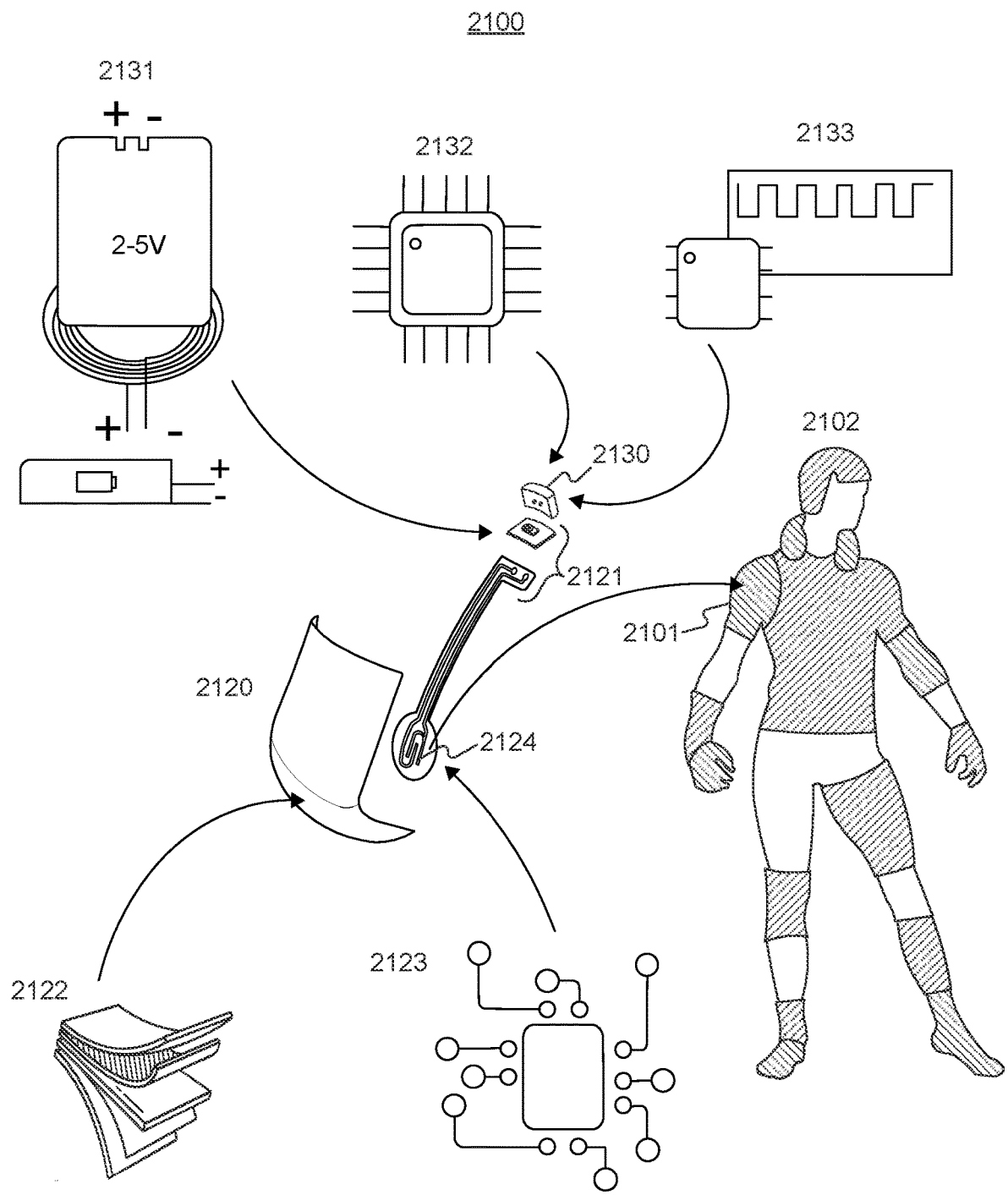
FIG. 21 shows an example fabric sensing device comprising an assembled fabric-based sensor interfacing with an electronic module, in accordance with example embodiments of the disclosure.

FIG. 21 shows an example diagram 2100 of an article of clothing attached to various components described herein, in accordance with example embodiments of the disclosure. In various embodiments, the components may include, but are not limited to, sensors, batteries, signal processing devices, logic devices, peripheral device controls, and the like. The components may be contained in a custom board and placed in a portion of the article of clothing such that the connection to the neighboring components is comfortable and still accessible for the user.

For example, FIG. 21 shows an example fabric sensing device 2101 (which may be similar to fabric sensing device 2000A depicted in FIG. 20A) comprising a textile good 2120 (which may be similar to textile good 2001 depicted in FIG. 20A) interfacing with an electronic module 2130 (which may be similar to electronic module 2007 depicted in FIG. 20A), in accordance with example embodiments of the disclosure. In some embodiments, the textile good 2120 may comprise one or more layers of fabric 2122, where one or more patterns of conductive and non-conductive threads form an electrical circuit 2123. In some embodiments, the electrical circuit 2123 may comprise fabric sensors 2124 (which may be similar to fabric sensors 2003 depicted in FIG. 20A) configured to output an electrical signal in response to external forces and terminate at a connection mechanism 2121 (which may be similar to a combination of connectors 2005 and intermediate connectors 2006 depicted in FIG. 20A). In some embodiments, the connection mechanism 2121 may allow the electronic module 2130 to electrically couple with the fabric sensors 2124 reversibly, semi-permanently, or permanently. Electronic module 2130 may comprise a battery device 2131, a microcontroller device 2132, and a radio frequency (RF) device 2133.

As depicted in FIG. 21, fabric sensing device 2101 may be placed in a large garment area (e.g., around the abdomen) or in multiple pieces of garments, so that they can be worn by a user 2102 with less discomfort while maximizing utilization. For example, larger components such as battery device 2131 can be embedded into the base or top of a garment where it is easily accessible through wireless charging, and microcontroller device 2132 and other components can be scattered to other portions of a garment or to other pieces of garments.

In some embodiments, battery device 2131 may include a battery pack that may be rechargeable through wired or wireless charging techniques. Battery device 2131 may be positioned in electronic module 2130 at a location convenient for charging. In some embodiments, the battery device 2131 may have a limited capacity, and an external power source (not shown) may be used from time to time to recharge the battery device 2131. In further embodiments, the assembled fabric-based sensor 2120 may also comprise a battery device (not shown) similar to batter device 2131.

In some embodiments, microcontroller device 2132 may be configured to read data from peripheral sensors such as the pressure and IMU devices of the assembled fabric-based sensor 2120. Functions of microcontroller device 2132 are discussed further in detail below.

In some embodiments, RF device 2133 may be configured to transmit and receive information via a wireless connection (e.g., Wi-Fi, Bluetooth, cellular, etc.). Once the data is read, processed, and formatted into readable and usable data by microcontroller device 2132, the RF device 2133 may transmit the data to a specified receiver such as a server or a personal computer in order to store and further process aggregated amounts of the data.

Turning back to electronic module 2130, depicted in FIG. 21, the assembled fabric-based sensor 2120 may be used with or without electronic module 2130. Inclusion of assembled fabric-based sensor 2120 and electronic module 2130 may be non-exclusive. For example, the assembled fabric-based sensor 2120 can be worn without the electronic module 2130 (as a regular article of clothing) or electronic module 2130 may be replaced with another similar, modified, or upgraded electronic module. For example, after electronic module 2130 is detached from assembled fabric-based sensor 2120, electronic module 2130 can be attached to a different assembled fabric-based sensor 2120 while the original assembled fabric-based sensor 2120 is washed, stored, modified, or replaced. Similarly, another electronic module may be attached to the original assembled fabric-based sensor 2120. Alternatively, or additionally, the electronic module 2130 can be configured to be connected or paired to more than one specified receiver so that more than one user may use the electronic module 2130 with or without their own assembled fabric-based sensor.

When electronic module 2130 is attached to the assembled fabric-based sensor 2120, the electronic module 2130 may perform its usual functions herein, receiving and recording data from the sensor and transmitting the data to a specified receiver for analyses. In some embodiments, electronic module 2130 may also monitor the operating states of the assembled fabric-based sensor 2120 and function as its input/output means. For example, electronic module 2130 may receive user inputs (e.g., button clicks), output a notification (e.g., battery low), or perform other preprogrammed routines (e.g., calibrate the integrated sensors 2124).

Figure 22:
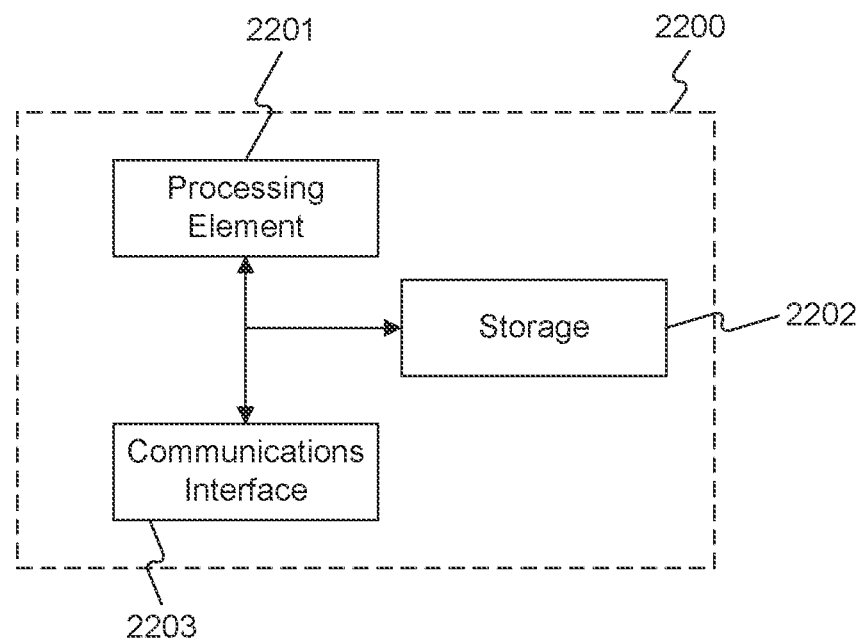
FIG. 22 shows an example schematic of a management computing entity, in accordance with example embodiments of the disclosure.

FIG. 22 shows an example schematic of a management computing entity 2200, in accordance with example embodiments of the disclosure. The management computing entity 2200 may be, for example, a server that is in communication with an assembled fabric-based sensor (e.g., 2120) via an RF device (e.g., 2133). In general, the terms computing entity, computer, entity, device, system, and/or similar words used herein interchangeably may refer to, for example, one or more computers, computing entities, desktop computers, mobile phones, tablets, phablets, notebooks, laptops, distributed systems, gaming consoles, watches, glasses, iBeacons, proximity beacons, key fobs, radio frequency identification (RFID) tags, ear pieces, scanners, televisions, dongles, cameras, wristbands, wearable items/devices, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In one embodiment, these functions, operations, and/or processes can be performed on data, content, information, and/or similar terms used herein interchangeably.

As shown in FIG. 22, in some embodiments, management computing entity 2200 may include or be in communication with one or more processing elements 2201 (also referred to as processors, processing circuitry, and/or similar terms used herein interchangeably) that communicate with other elements within management computing entity 2200 via a bus, for example. As will be understood, processing element 2201 may be embodied in a number of different ways. For example, processing element 2201 may be embodied as one or more complex programmable logic devices (CPLDs), microprocessors, multi-core processors, coprocessing entities, application-specific instruction-set processors (ASIPs), microcontrollers, and/or controllers. Further, processing element 2201 may be embodied as one or more other processing devices or circuitry. The term circuitry may refer to an entirely hardware embodiment or a combination of hardware and computer program products. Thus, processing element 2201 may be embodied as integrated circuits, application specific integrated circuits (ASICs), field programmable gate arrays (FPGAs), programmable logic arrays (PLAs), hardware accelerators, other circuitry, and/or the like. As will therefore be understood, the processing element 2201 may be configured for a particular use or configured to execute instructions stored in volatile or non-volatile media or otherwise accessible to the processing element 2201. As such, whether configured by hardware or computer program products, or by a combination thereof, the processing element 2201 may be capable of performing steps or operations according to embodiments of the present disclosure when configured accordingly.

In some embodiments, management computing entity 2200 may further include or be in communication with a storage 2202 (also referred to as non-volatile storage, memory, memory storage, memory circuitry and/or similar terms used herein interchangeably). In one embodiment, the storage 2202 may include one or more non-volatile storage or memory media, including but not limited to a floppy disk, flexible disk, hard disk, solid-state storage (SSS) (e.g., a solid state drive (SSD), solid state card (SSC), solid state module (SSM), enterprise flash drive, magnetic tape, or any other non-transitory magnetic medium, read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like. As will be recognized, the storage 2202 may store databases, database instances, database management systems, data, applications, programs, program modules, scripts, source code, object code, byte code, compiled code, interpreted code, machine code, executable instructions, and/or the like, which may be used to control certain aspects of the operation of the management computing entity 2200 with the assistance of the processing element 2201. The term database, database instance, database management system, and/or similar terms used herein interchangeably may refer to a collection of records or data that is stored in a computer-readable storage medium using one or more database models, such as a hierarchical database model, network model, relational model, entity-relationship model, object model, document model, semantic model, graph model, and/or the like.

As indicated, in some embodiments, the management computing entity 2200 may also include one or more communications interfaces 2203 for communicating with various computing entities, such as by communicating data, content, information, and/or similar terms used herein interchangeably that can be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the management computing entity 2200 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

Although not shown, management computing entity 2200 may include or be in communication with one or more input elements, such as a keyboard input, a mouse input, a touch screen/display input, motion input, movement input, audio input, pointing device input, joystick input, keypad input, and/or the like. Management computing entity 2200 may also include or be in communication with one or more output elements (not shown), such as audio output, video output, screen/display output, motion output, movement output, and/or the like.

As will be appreciated, one or more of the components of management computing entity 2200 may be located remotely from other management computing entity components, such as in a distributed system. Furthermore, one or more of the components may be combined and additional components performing functions described herein may be included in the management computing entity 2200. Thus, management computing entity 2200 can be adapted to accommodate a variety of needs and circumstances. As will be recognized, these architectures and descriptions merely provide examples and are not limiting to the various embodiments.

Figure 23:
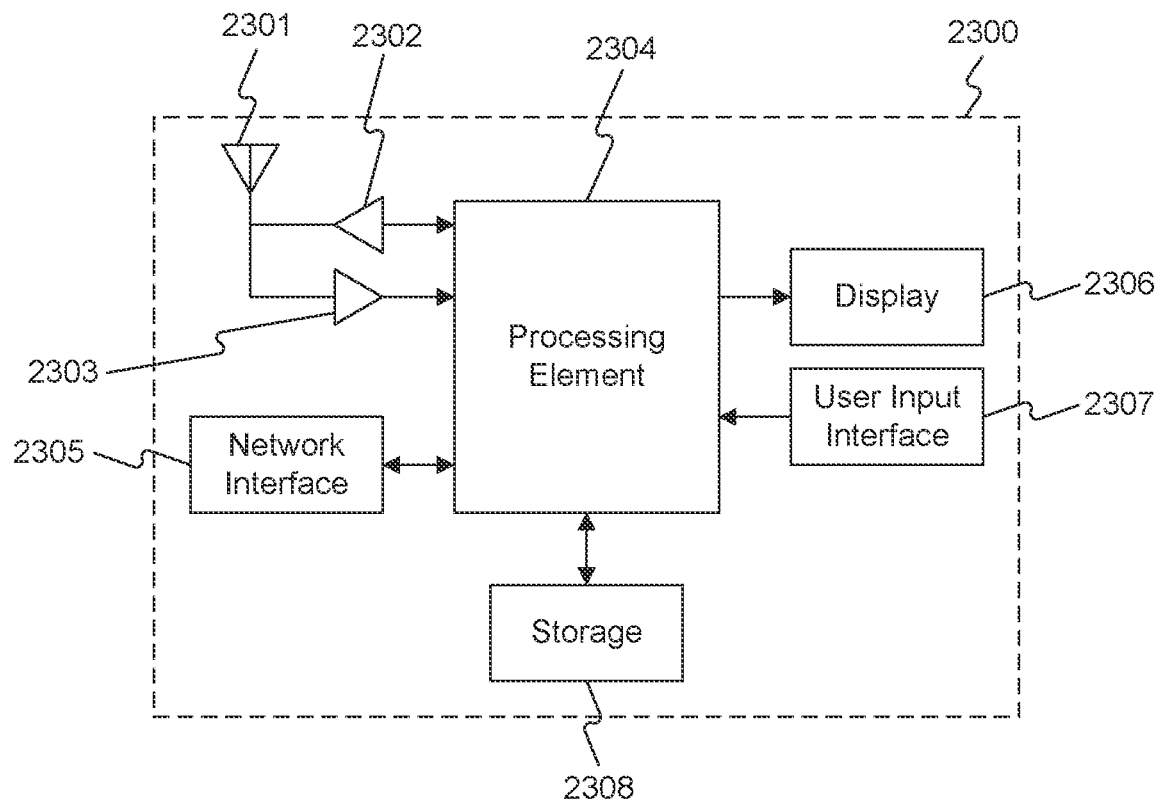
FIG. 23 shows an example schematic of a user computing entity, in accordance with example embodiments of the disclosure.

FIG. 23 shows an example schematic of a user computing entity 2300, in accordance with example embodiments of the disclosure. For example, the user computing entity 2300 can be a personal computer or a mobile device that is in communication with a fabric sensing device (e.g., 2101) via a RF device (e.g., 2100C). In general, the terms device, system, computing entity, entity, and/or similar words used herein interchangeably may refer to, for example, one or more computers, computing entities, desktops, mobile phones, tablets, phablets, notebooks, laptops, distributed systems, gaming consoles, watches, glasses, key fobs, radio frequency identification (RFID) tags, ear pieces, scanners, cameras, wristbands, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. User computing entities 2300 can be operated by various parties, such as an individual, a company, an organization, an entity, a department within an organization, a representative of an organization and/or person, and/or the like. As shown in FIG. 23, user computing entity 2300 can include an antenna 2301, a transmitter 2302 (e.g., radio), a receiver 2303 (e.g., radio), and a processing element 2304 (e.g., CPLDs, microprocessors, multi-core processors, coprocessing entities, ASIPs, microcontrollers, and/or controllers) that provides signals to and receives signals from the transmitter 2302 and receiver 2303, respectively.

The signals provided to and received from transmitter 2302 and receiver 2303, respectively, may include signaling information in accordance with air interface standards of applicable wireless systems. In this regard, user computing entity 2300 may be capable of operating with one or more air interface standards, communication protocols, modulation types, and access types. More particularly, the user computing entity 2300 may operate in accordance with any of a number of wireless communication standards and protocols, such as those described above with regard to management computing entity 2200. In a particular embodiment, user computing entity 2300 may operate in accordance with multiple wireless communication standards and protocols, such as UMTS, CDMA2000, 1×RTT, WCDMA, TD-SCDMA, LTE, E-UTRAN, EVDO, HSPA, HSDPA, Wi-Fi, Wi-Fi Direct, WiMAX, UWB, IR, NFC, Bluetooth, USB, and/or the like. Similarly, user computing entity 2300 may operate in accordance with multiple wired communication standards and protocols, such as those described above with regard to management computing entity 2200 via a network interface 2305.

Via these communication standards and protocols, user computing entity 2300 can communicate with various other entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). The user computing entity 2300 can also download changes, add-ons, and updates, for instance, to its firmware, software (e.g., including executable instructions, applications, program modules), and operating system.

According to some embodiments, user computing entity 2300 may include location determining aspects, devices, modules, functionalities, and/or similar words used herein interchangeably. For example, user computing entity 2300 may include outdoor positioning aspects, such as a location module adapted to acquire, for example, latitude, longitude, altitude, geocode, course, direction, heading, speed, universal time (UTC), date, and/or various other information/data. In one embodiment, the location module can acquire data, sometimes known as ephemeris data, by identifying the number of satellites in view and the relative positions of those satellites. The satellites may be a variety of different satellites, including Low Earth Orbit (LEO) satellite systems, Department of Defense (DOD) satellite systems, the European Union Galileo positioning systems, the Chinese Compass navigation systems, Indian Regional Navigational satellite systems, and/or the like. Alternatively, the location information can be determined by triangulating the user computing entity's 2300 position in connection with a variety of other systems, including cellular towers, Wi-Fi access points, and/or the like. Similarly, the user computing entity 2300 may include indoor positioning aspects, such as a location module adapted to acquire, for example, latitude, longitude, altitude, geocode, course, direction, heading, speed, time, date, and/or various other information/data. Some of the indoor systems may use various position or location technologies including RFID tags, indoor beacons or transmitters, Wi-Fi access points, cellular towers, nearby computing devices (e.g., smartphones, laptops) and/or the like. For instance, such technologies may include the iBeacons, Gimbal proximity beacons, Bluetooth Low Energy (BLE) transmitters, NFC transmitters, and/or the like. These indoor positioning aspects can be used in a variety of settings to determine the location of someone or something to within inches or centimeters.

User computing entity 2300 may also comprise a user interface (that can include a display 2306 coupled to a processing element 2304) and/or a user input interface 2307 (coupled to a processing element 2304). For example, the user interface may be a user application, browser, user interface, and/or similar words used herein interchangeably executing on and/or accessible via the user computing entity 2300 to interact with and/or cause display of information from the management computing entity 2200, as described herein. User input interface 2307 can comprise any of a number of devices or interfaces allowing the user computing entity 2300 to receive data, such as a keypad (hard or soft), a touch display, voice/speech or motion interfaces, or other input device. In embodiments including a keypad, the keypad can include (or cause display of) the conventional numeric (0-9) and related keys (#, *), and other keys used for operating the user computing entity 2300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

User computing entity 2300 can also include storage 2308, which can be volatile or non-volatile, and embedded and/or may be removable. For example, a non-volatile storage may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. a volatile storage may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The storage 2308 can store databases, database instances, database management systems, data, applications, programs, program modules, scripts, source code, object code, byte code, compiled code, interpreted code, machine code, executable instructions, and/or the like to implement the functions of the user computing entity 2300. As indicated, this may include a user application that is resident on the entity or accessible through a browser or other user interface for communicating with the management computing entity 2200 and/or various other computing entities.

In other embodiments, user computing entity 2300 may include one or more components or functionality that are the same or similar to those of the management computing entity 2200, as described in greater detail above. As will be recognized, these architectures and descriptions merely provide examples and are not limiting to the various embodiments.

Figure 24:
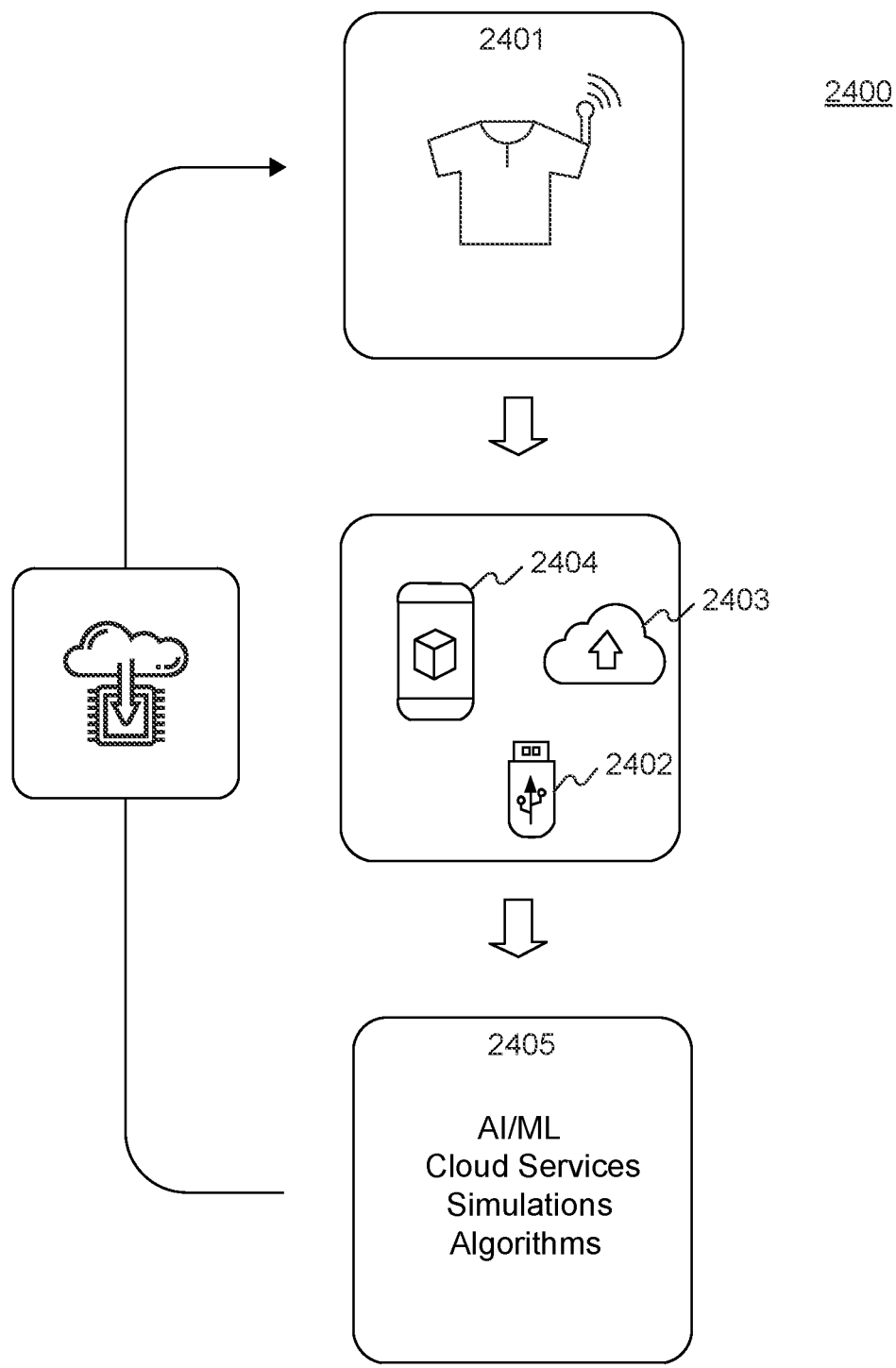
FIG. 24 shows a diagram representing an example flow of communication and data between the fabric-based sensing device(s) and one or more peripheral devices or servers, in accordance with example embodiments of the disclosure.

FIG. 24 shows a diagram 2400 representing an example flow of communication and data between fabric-based sensing device(s) 2401 and one or more peripheral devices or servers (e.g., management computing entity 2200 and/or user computing entity 2300), in accordance with example embodiments of the disclosure.

In various embodiments, electromechanical measurements collected by integrated sensors (e.g., 2124) in the fabric-based sensing device 2401 may be converted into electrical signals. Such signals may be received and processed by a microcontroller device (e.g., 2131) of the fabric-based sensing device 2401 into meaningful data, which may be stored in a storage device (not shown) connected to the microcontroller device.

In various embodiments, such data can be exported from the fabric-based sensing device 2401 by wired or wireless connections. The exported data can further be stored, aggregated, analyzed, and shared using multiple online and offline methods. In some embodiments, wired connections (e.g., USB 2402) may be used to download the data to another computer or application for offline processing. In other embodiments, a wireless connection may use any suitable air interface (e.g., Wi-Fi, Bluetooth, etc.) to transfer data to another device such as an online server, a cloud server 2403, or application for data processing. Such online server or cloud server 2403 may include, for example, the management computing element 2200. In some embodiments, the data can be transferred to an app on a user's phone 2404 (e.g., user computing entity 2300).

In various embodiments, the exported data can be managed and analyzed online using a server (e.g., management computing entity 2200 or cloud server 2403) or offline using a personal device (e.g., user computing entity 2300 or user's phone 2404). Both modalities may utilize one or more artificial intelligence (AI)-based algorithms 2405 to monitor the data.

In various embodiments, it may be computationally difficult to model large data sets (e.g., high dimensional or large volume data sets), generated over time by the fabric-based electronic device 2401, with definitive mathematical functions that describe a state associated with the data (e.g., a walking or jumping state). Accordingly, such large data sets may be used in connection with the one or more AI-based algorithms 2405, where iterative reinforced learning algorithms can supply latent variables that are helpful in forming a predictive model describing the data. In one embodiment, machine learning algorithms may be used to design an AI system that learns from a user's motion and recognizes patterns or changes in the user's movement or gait. The AI algorithm may be used for tracking a user's performance, such as for athletic purposes like in sports training or for tracking regular routines such as bending or stretching.

In some embodiments, the AI-based algorithms 2405 may facilitate automating one or more features described herein. To provide for or aid in the numerous determinations (e.g., determine, ascertain, infer, calculate, predict, prognose, estimate, derive, forecast, detect, compute) described herein, the AI-based algorithms 2405 can examine the entirety or a subset of the data to which it is granted access and can provide for reasoning about or determine states of the system, environment, etc. from a set of observations as captured via events and/or data. The determinations can be employed, for example, to identify a specific context, action, or state; or can generate a probability distribution over states. In some embodiments, the determinations can be probabilistic, where the AI-based algorithms 2405 may compute a probability distribution of different states of interest based on a consideration of data and events.

Additionally or alternatively, the determinations can also be employed for composing higher-level events from a set of events and/or data. Such determinations can result in the construction of new events or actions from a set of observed events and/or stored event data, where, for example, the events may be correlated in close temporal proximity or the events and data may come from one or several event and data sources (e.g., different sensor inputs). The AI-based algorithms 2405 disclosed herein can employ various classification (explicitly trained (e.g., via training data) as well as implicitly trained (e.g., via observing behavior, preferences, historical information, receiving extrinsic information, etc.) schemes and/or systems (e.g., support vector machines, neural networks, expert systems, Bayesian belief networks, fuzzy logic, data fusion engines, etc.) in connection with performing automatic and/or determined action in connection with the claimed subject matter. Thus, classification schemes and/or systems can be used to automatically learn and perform a number of functions, actions, and/or determinations.

In some embodiments of the AI-based algorithms 2405, a classifier can map an input attribute vector, e.g., $z=(z1, z2, z3, z4, \ldots, zn)$, to a confidence that the input belongs to a class, as by $f(z)=confidence(class)$. Such classification can employ a probabilistic and/or statistical-based analysis (e.g., factoring into the analysis utilities and costs) to determinate an action to be automatically performed. A support vector machine (SVM) is an example of a classifier that can be employed. In some embodiments, the SVM may operate by finding a hyper-surface in the space of possible inputs, where the hyper-surface may attempt to split triggering criteria from non-triggering events. This may make the classification correct for testing data that is near, but not identical to training data. Other directed and undirected model classification approaches may include, for example, naïve Bayes, Bayesian networks, decision trees, neural networks, fuzzy logic models, and/or probabilistic classification models providing different patterns of independence. Classification techniques discussed herein may also include statistical regression models that are utilized to develop models of priority.

In various embodiments, the data processed by the AI-based algorithms 2405 can be redistributed through online (e.g., through cloud server 2403) or offline (e.g., through user's phone 2404 or USB 2402) methods to the fabric-based sensing device 2401. In various embodiments, such redistribution may be in the form of, for example, an updated firmware and/or code on the fabric-based sensing device 2401. The updates may enable new features for the fabric-based sensing device 2401, such as faster data capturing rates, improved signal filtering methods, and more efficient communication of data for subsequent analyses.

Figure 25:
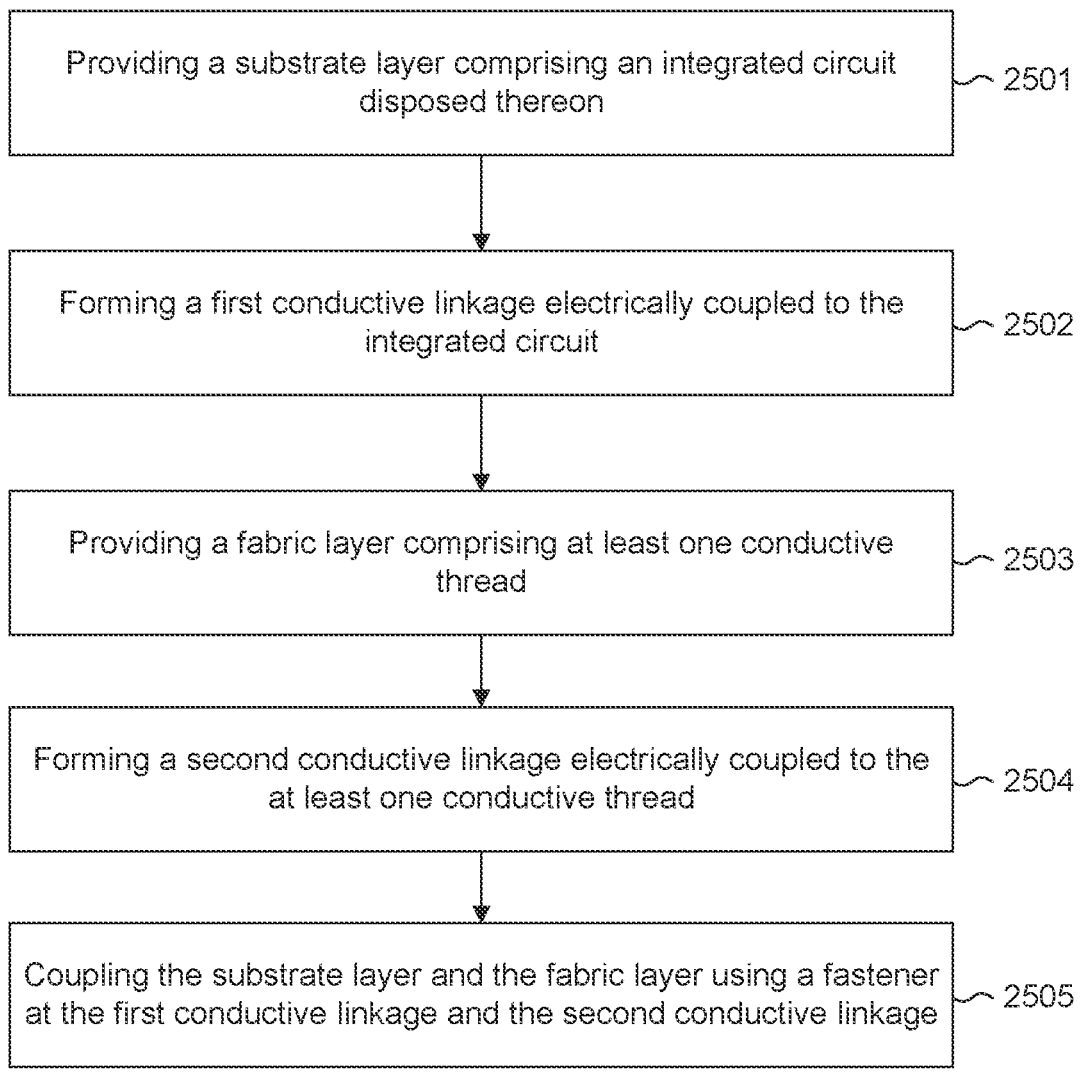
FIG. 25 shows a flow diagram of an example process for fabricating an electrical circuit assembly, in accordance with example embodiments of the disclosure.

FIG. 25 shows a flow diagram of an example process 2500 for fabricating an electrical circuit assembly, in accordance with example embodiments of the disclosure. In some embodiments, the electrical circuit assembly may comprise a circuit board with an IC, such as the device shown in FIG. 3A, and a fabric-based sensor, such as the device shown in FIG. 3B. Different steps of process 2500 may be performed using conventional techniques such as sewing, printing conductive traces on a PCB, depositing chemical substances, or the like.

Step 2501 may include providing a substrate layer comprising an IC disposed thereon. The substrate layer may comprise a PCB substrate or a flexible circuit as discussed above, and the IC may include various electrical circuit components that are found in, for example, the electrical circuit 2123.

Step 2502 may include forming a first conductive linkage electrically coupled to the IC. The first conductive linkage may take the form of any conductive linkages discussed above with respect to, for example, FIGS. 3A, 3C, 4A, 4C, 4E, 4F, 4G, 6-8, 9A, 10A, 11A, and 13A. In some embodiments, the first conductive linkage my terminate on or at the end of a conductive trace that is electrically connected to the IC. For example, a conductive linkage may be formed by: (1) making a hole extending from a first side of the substrate layer to a second side of the substrate layer, wherein an internal surface of the hole is covered with a conductive material, as discussed above with respect to FIG. 4A; (2) disposing, on the substrate layer, a porous or semi-porous material or a thin plastic configured to be embroidered with one or more stitching paths of at least one conductive thread, as discussed above with respect to FIG. 4C; or (3) disposing, on the substrate layer, a semi-permeable region configured to be penetrated by a fastener or a clamp, as discussed above with respect to FIG. 4E. Other processes of forming the first conductive linkage are also within the scope of the current disclosure, as would be obvious to one of ordinary skill in the art based on the embodiments discussed above.

Step 2503 may include providing a fabric layer comprising at least one conductive thread. The fabric layer may comprise any fabric or a portion of a clothing as discussed above, where the at least one conductive thread is sewn into the fabric layer. For example, the at least one conductive thread may be sewn using a top-thread and a bobbin with at least one non-conductive thread, so that the at least one conductive thread interdigitates the fabric layer with exposed and non-exposed areas on the bottom or the top surface of the fabric layer. The pattern in which the conductive thread and the non-conductive thread are sewn may form a sensor pattern (e.g., integrated sensors 2124) configured to output an electrical signal in response to external forces. In further embodiments, an amount of the exposed region may be determined by at least one of: (1) the tension on the conductive thread and the tension on the non-conductive thread; (2) the feed length of a stitching pattern of the conductive thread; (3) the weight of the conductive thread; or (4) the length of a cross-stitch of the conductive thread.

Step 2504 may comprise forming a second conductive linkage electrically coupled to the conductive thread. The second conductive linkage may take the form of any conductive linkages discussed above with respect to, for example, FIGS. 3B, 3C, 4B, 4D, 4E, 4F, 4G, 5A-5D, 6-8, 9A, 10A, 11A, and 13A. Any process of forming the second conductive linkage is within the scope of the current disclosure, as would be obvious to one of ordinary skill in the art based on the embodiments discussed above.

In some embodiments, the second conductive linkage may be formed on an exposed region of the conductive thread, so that an electrical signal carried by the conductive thread can flow through the second conductive linkage as well. To this end, the second conductive linkage may comprise, for example, a snapping mechanism that is crimped onto the fabric substrate, wherein the snapping mechanism is configured to be received by a complementary receiver on the first conductive linkage.

In some embodiments, the exposed region of the conductive thread may cover an area that is smaller than or equal to a conductive area on the fabric layer that is covered by the second conductive linkage. Additionally or alternatively, the conductive thread may be sewn in an overlapping pattern underneath the second conductive linkage so as to increase conductivity of electrical signal at the region. Still further, the process 2500 may further comprise a step for disposing at least one conductive layer above and/or below the fabric layer, wherein the size of the at least one conductive layer and the size of the second conductive linkage are proportional to the size of the exposed region of the conductive thread. Such at least one conductive layer may serve to increase the surface area of conductive region on the fabric layer and thus increase conductivity of the electrical signal.

Step 2505 may comprise coupling the substrate layer and the fabric layer using a fastener (i.e., a conductive linker) at the first conductive linkage and the second conductive linkage. In some embodiments, the fastener may take the form of any connection means discussed above that can electromechanically couple the substrate layer and the fabric layer. More specifically, the fastener may be electromechanically coupled to the first conductive linkage and the second conductive linkage formed on the substrate layer and the fabric layer, respectively, wherein the conductive linker may couple the conductive linkages permanently, semi-permanently, or reversibly. For example, the fastener may include any conductive linker discussed in FIGS. 3C, 4E, 4G, 4H, 6-8, 9A, 9B, 10B, 11A, 11B, 12A, and 12B. Any process of forming the conductive linker is within the scope of the current disclosure, as would be obvious to one of ordinary skill in the art based on the embodiments discussed above.

In some embodiments, the process 2500 may further comprise a step for disposing one or more intermediate layers between the substrate layer and the fabric layer, wherein the conductive linker is configured to penetrate the one or more intermediate layers and electrically couple the first conductive linkage and the second conductive linkage. Additionally or alternatively, the process 2500 may further comprise a step for disposing one or more additional layers above the substrate layer, between the substrate layer and the fabric layer, or below the fabric layer. Here, the conductive linker may selectively penetrate any of the additional layers, intermediate layers, substrate layer, or fabric layer so that only desired layers are coupled electromechanically.

In some embodiments, step 2505 may comprise folding the substrate layer onto the fabric layer so that the first conductive linkage is electrically coupled to the second conductive linkage and/or the conductive thread embedded in the fabric layer. In such embodiments, the substrate layer may comprise a flexible material (e.g., flexible circuit), wherein the first conductive linkage is positioned on the flexible material.

Although an example processing system has been described above, implementations of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random-access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a CRT (cathode ray tube) or LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component, e.g., as an information/data server, or that includes a middleware component, e.g., an application server, or that includes a front-end component, e.g., a client computer having a graphical user interface or a web browser through which a user can interact with an implementation of the subject matter described herein, or any combination of one or more such back-end, middleware, or front-end components. The components of the system can be interconnected by any form or medium of digital information/data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any embodiment or of what may be claimed, but rather as descriptions of features specific to particular embodiments. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

In some embodiments, the entire system can be implemented and offered to the end-users and operators over the Internet, in a so-called cloud implementation. No local installation of software or hardware would be needed, and the end-users and operators would be allowed access to the systems directly over the Internet, using either a web browser or similar software on a client, which client could be a desktop, laptop, mobile device, and so on. This eliminates any need for custom software installation on the client side and increases the flexibility of delivery of the service (software-as-a-service) and increases user satisfaction and ease of use. Various business models, revenue models, and delivery mechanisms are envisioned and are all to be considered within the scope of the present disclosure.

In general, the method executed to implement the embodiments of the invention, may be implemented as part of an operating system or a specific application, component, program, object, module or sequence of instructions referred to as "computer program(s)" or "computer code(s)." The computer programs typically comprise one or more instructions set at various times in various memory and storage devices in a computer, and that, when read and executed by one or more processors in a computer, cause the computer to perform operations necessary to execute elements involving the various aspects of the invention. Moreover, while the invention has been described in the context of fully functioning computers and computer systems, those skilled in the art will appreciate that the various embodiments of the invention are capable of being distributed as a program product in a variety of forms, and that the invention applies equally regardless of the particular type of machine or computer-readable media used to actually effect the distribution. Examples of computer-readable media include but are not limited to recordable type media such as volatile and non-volatile memory devices, floppy and other removable disks, hard disk drives, optical disks, which include Compact Disk Read-Only Memory (CD ROMS), Digital Versatile Disks (DVDs), etc., as well as digital and analog communication media.

One of ordinary skill in the art knows that the use cases, structures, schematics, and flow diagrams may be performed in other orders or combinations, but the inventive concepts remain without departing from the broader scope of the invention. Every embodiment may be unique, and methods/steps may be either shortened or lengthened, overlapped with the other activities, postponed, delayed, and continued after a time gap to practice the methods of the present disclosure.

Many modifications and other embodiments of the disclosure set forth herein will come to mind to one skilled in the art to which these embodiments pertain having the benefit of the teachings presented in the foregoing descriptions and the associated drawings. Therefore, it is to be understood that the embodiments are not to be limited to the specific embodiments disclosed and that modifications and other embodiments are intended to be included within the scope of the appended claims. Although specific terms are employed herein, they are used in a generic and descriptive sense only and not for purposes of limitation.

Although the present disclosure describes specific example embodiments, it will be evident that the various modification and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present disclosure.

What is claimed is:

1. An electrical circuit assembly comprising:
   a circuit component comprising:
      a substrate layer comprising an integrated circuit disposed on the substrate layer; and
      a first conductive linkage electrically coupled to the integrated circuit;
   a fabric-based component comprising:
      a fabric layer comprising a first at least one conductive thread; and
      a second conductive linkage electrically coupled to the first at least one conductive thread, wherein the second conductive linkage is not exposed to a first side of the fabric layer facing the circuit component; and
   a fastener configured to couple the circuit component and the fabric-based component at the first conductive linkage and the second conductive linkage; and
   one or more intermediate layers between the substrate layer and the fabric layer, wherein the one or more intermediate layers comprise one or more additional conductive linkages in alignment with the first conductive linkage and the second conductive linkage.

2. The electrical circuit assembly of claim 1, wherein the first conductive linkage comprises at least one of:
   a hole extending from a first side of the substrate layer to a second side of the substrate layer, wherein an internal surface of the hole is covered with a conductive material;
   a penetrable material configured to be embroidered with one or more stitching paths of a second at least one conductive thread; or
   a semi-permeable region configured to be penetrated by the fastener.

3. The electrical circuit assembly of claim 1, wherein the first at least one conductive thread is exposed on the fabric substrate, and wherein an exposed region of the first at least one conductive thread covers an area that is smaller than or equal to a conductive area on the fabric layer that is covered by the second conductive linkage.

4. The electrical circuit assembly of claim 1, wherein:
   the fabric layer further comprises at least one non-conductive thread;
   the first at least one conductive thread is exposed on the fabric layer; and
   an amount of exposed portion of the first at least one conductive thread is variable based on at least one of:
      a first tension on the first at least one conductive thread and a second tension on the at least one non-conductive thread,
      a feed length of a stitching pattern of the first at least one conductive thread,
      a weight of the first at least one conductive thread,
      a ply-count of the first at least one conductive thread,
      a density of the first at least one conductive thread, or
      a length of a cross-stitch of the first at least one conductive thread.

5. The electrical circuit assembly of claim 1, wherein:
   the fabric-based component further comprises at least one conductive layer above or below the fabric layer;
   the first at least one conductive thread is exposed on the fabric layer; and
   a first size of the at least one conductive layer and a second size of the second conductive linkage are proportional to a third size of the exposed region of the first at least one conductive thread.

6. The electrical circuit assembly of claim 1, wherein the second conductive linkage comprises a snapping mechanism that is crimped onto the fabric layer, wherein the snapping mechanism is configured to be received by a complementary receiver on the first conductive linkage.

7. The electrical circuit assembly of claim 1, wherein the fastener is configured to couple the circuit component and the fabric-based component using a conductive linker, wherein the conductive linker is electrically coupled with the first conductive linkage and the second conductive linkage.

8. The electrical circuit assembly of claim 7,
   wherein the conductive linker is configured to penetrate the one or more intermediate layers and electrically couple the first conductive linkage and the second conductive linkage.

9. The electrical circuit assembly of claim 1, wherein the fastener is configured to couple the circuit component and the fabric-based component irreversibly.

10. The electrical circuit assembly of claim 1, wherein the fastener is configured to couple the circuit component and the fabric-based component reversibly.

11. The electrical circuit assembly of claim 1, wherein the fastener is configured to couple the circuit component and the fabric-based component using at least one of:
   a magnetic force, a chemical bondage, a mechanical force, or a combination thereof.

12. The electrical circuit assembly of claim 1, wherein the circuit component and the fabric-based component are arranged vertically, and wherein the first conductive linkage and the second conductive linkage are vertically aligned.

13. The electrical circuit assembly of claim 1, wherein the circuit component and the fabric-based component are arranged horizontally, wherein the first conductive linkage is laterally offset from the second conductive linkage.

14. The electrical circuit assembly of claim 1, wherein:
   the substrate layer comprises a flexible material that is folded onto the fabric layer,
   the first conductive linkage is positioned on the flexible material, and
   the first conductive linkage is configured to be electrically coupled to the first at least one conductive thread.

15. The electrical circuit assembly of claim 1, wherein the first conductive linkage comprises a penetrable, semi-permeable material configured to be embroidered with one or more stitching paths of a second at least one conductive thread.

16. An electrical circuit assembly comprising:
one or more circuit components, each comprising:
a substrate layer comprising an integrated circuit disposed on the substrate layer; and
a first conductive linkage electrically coupled to the integrated circuit;
one or more fabric-based components comprising:
one or more fabric layers, wherein a subset of the one or more fabric layers comprise at least one conductive thread; and
one or more second conductive linkages electrically coupled to the at least one conductive thread, wherein the one or more second conductive linkages is not exposed to a first side of the one or more fabric layers facing the one or more circuit components;
one or more fasteners configured to couple the one or more circuit components and the one or more fabric-based components at the one or more first conductive linkages and the one or more second conductive linkages;
one or more intermediate layers between the substrate layer and the one or more fabric layers, wherein the one or more intermediate layers comprise one or more additional conductive linkages,
wherein the one or more first conductive linkages, the one or more second conductive linkages, and the one or more additional conductive linkages are aligned to a common vertical axis or laterally offset.

17. A method of fabricating an electrical circuit assembly comprising:
providing a substrate layer having an integrated circuit disposed on the substrate layer;
forming a first conductive linkage electrically coupled to the integrated circuit;
providing a fabric layer comprising a first at least one conductive thread;
forming a second conductive linkage electrically coupled to the first at least one conductive thread, wherein the second conductive linkage is not exposed to a first side of the fabric layer facing the circuit component;
coupling the substrate layer and the fabric layer using a fastener at the first conductive linkage and the second conductive linkage; and
providing one or more intermediate layers between the substrate layer and the fabric layer, wherein the one or more intermediate layers comprise one or more additional conductive linkages in alignment with the first conductive linkage and the second conductive linkage.

18. The method of claim 17, wherein forming the first conductive linkage comprises at least one of:
making a hole extending from a first side of the substrate layer to a second side of the substrate layer, wherein an internal surface of the hole is covered with a conductive material;
disposing, on the substrate layer, penetrable material configured to be embroidered with one or more stitching paths of a second at least one conductive thread; or
disposing, on the substrate layer, a semi-permeable region configured to be penetrated by the fastener.

19. The method of claim 17, wherein the first at least one conductive thread is exposed on the fabric substrate, and wherein an exposed region of the first at least one conductive thread covers an area that is smaller than or equal to a conductive area on the fabric layer that is covered by the second conductive linkage.

20. The method of claim 17, wherein
the fabric layer further comprises at least one non-conductive thread;
the first at least one conductive thread is exposed on the fabric layer; and
an amount of exposed portion of the first at least one conductive thread is variable based on at least one of:
a first tension on the first at least one conductive thread and a second tension on the at least one non-conductive thread,
a feed length of a stitching pattern of the first at least one conductive thread,
a weight of the first at least one conductive thread,
a ply-count of the first at least one conductive thread,
a density of the first at least one conductive thread, or
a length of a cross-stitch of the first at least one conductive thread.

21. The method of claim 17,
further comprising: disposing at least one conductive layer above or below the fabric layer,
wherein the first at least one conductive thread is exposed on the fabric layer, and
wherein a first size of the at least one conductive layer and a second size of the second conductive linkage are proportional to a third size of the exposed region of the first at least one conductive thread.

22. The method of claim 17, wherein the second conductive linkage comprises a snapping mechanism that is crimped onto the fabric layer, wherein the snapping mechanism is configured to be received by a complementary receiver on the first conductive linkage.

23. The method of claim 17, wherein coupling the substrate layer and the fabric layer comprises: installing a conductive linker electrically coupled with the first conductive linkage and the second conductive linkage.

24. The method of claim 23, further comprising:
disposing one or more intermediate layers between the substrate layer and the fabric layer,
wherein the conductive linker is configured to penetrate the one or more intermediate layers and electrically couple the first conductive linkage and the second conductive linkage.

25. The method of claim 17, wherein the substrate layer and the fabric layer are coupled irreversibly.

26. The method of claim 17, wherein the substrate layer and the fabric layer are coupled reversibly.

27. The method of claim 17, wherein the substrate layer and the fabric layer are coupled using at least one of:
a magnetic force, a chemical bondage, a mechanical force, or a combination thereof.

28. The method of claim 17, further comprising: arranging the substrate layer and the fabric layer in a vertical direction, wherein the first conductive linkage and the second conductive linkage are vertically aligned.

29. The method of claim 17, further comprising: arranging the substrate layer and the fabric layer in a horizontal direction, wherein the first conductive linkage is laterally offset from the second conductive linkage.

30. The method of claim 17,
wherein the substrate layer comprises a flexible material and the method further comprises folding the substrate layer onto the fabric layer;
wherein the first conductive linkage is positioned on the flexible material; and wherein the first conductive linkage is electrically coupled to the first at least one conductive thread.

31. The method of claim 17, wherein forming the first conductive linkage comprises disposing, on the substrate layer, a penetrable, semi-permeable material configured to be embroidered with one or more stitching paths of a second at least one conductive thread.

32. A method of fabricating an electrical circuit assembly comprising:
   providing one or more substrate layers, each comprising an integrated circuit disposed on the corresponding substrate layer;
   forming one or more first conductive linkages electrically coupled to the one or more integrated circuits;
   providing one or more fabric layers comprising first one or more conductive threads;
   forming one or more second conductive linkages electrically coupled to the first one or more conductive threads, wherein the one or more second conductive linkages is not exposed to a first side of the one or more fabric layers facing the one or more circuit components;
   providing one or more intermediate layers between the one or more substrate layers and the one or more fabric layers, wherein the one or more intermediate layers comprise one or more additional conductive linkages
   arranging the one or more substrate layers and the one or more fabric layers, wherein the one or more first conductive linkages, the one or more second conductive linkages, and the one or more additional conductive linkages are aligned to a common vertical axis or laterally offset; and
   coupling the one or more substrate layers and the one or more fabric layers using a fastener at the one or more first conductive linkages and the one or more second conductive linkages.

* * * * *